(12) United States Patent
Ozaki et al.

(10) Patent No.: US 7,253,882 B2
(45) Date of Patent: Aug. 7, 2007

(54) EXPOSURE METHOD AND EXPOSURE SYSTEM

(75) Inventors: Takao Ozaki, Kanagawa-ken (JP);
Takayuki Uemura, Kanagawa-ken (JP);
Yoji Okazaki, Kanagawa-ken (JP);
Norihisa Takada, Kanagawa-ken (JP);
Yuji Shimoyama, Kanagawa-ken (JP);
Daisuke Nakaya, Kanagawa-ken (JP);
Katsuto Sumi, Kanagawa-ken (JP);
Morimasa Sato, Fujinomiya (JP);
Mitsutoshi Tanaka, Fujinomiya (JP)

(73) Assignee: Fujifilm Corporation, Tokyo (JP)

( * ) Notice: Subject to any disclaimer, the term of this patent is extended or adjusted under 35 U.S.C. 154(b) by 118 days.

(21) Appl. No.: 11/020,574

(22) Filed: Dec. 27, 2004

(65) Prior Publication Data

US 2005/0206866 A1    Sep. 22, 2005

(30) Foreign Application Priority Data

Dec. 26, 2003  (JP)  ............................. 2003-433237
Dec. 26, 2003  (JP)  ............................. 2003-433934

(51) Int. Cl.
*G03B 27/54*  (2006.01)

(52) U.S. Cl. .......................................... 355/67; 355/71
(58) Field of Classification Search ................. 355/67, 355/71
See application file for complete search history.

(56) References Cited

U.S. PATENT DOCUMENTS

| 2003/0077089 | A1* | 4/2003 | Luellau ....................... 399/130 |
| 2004/0190030 | A1* | 9/2004 | Foster et al. ................. 358/1.9 |
| 2005/0179882 | A1* | 8/2005 | Gui et al. ..................... 355/55 |
| 2005/0206866 | A1* | 9/2005 | Ozaki et al. .................. 355/53 |

FOREIGN PATENT DOCUMENTS

| JP | 2000-206571 A | 7/2000 |
| JP | 2002-350897 A | 12/2002 |

* cited by examiner

*Primary Examiner*—D. Rutledge
(74) *Attorney, Agent, or Firm*—Sughrue Mion, PLLC

(57) ABSTRACT

Light modulated by a spatial light modulator is projected onto photosensitive material and the photosensitive material is exposed to light in a predetermined pattern. The action of the spatial light modulator is controlled so that the amount of the light projected onto the photosensitive material is changed in at least two stages according to the part of the photosensitive material.

37 Claims, 26 Drawing Sheets

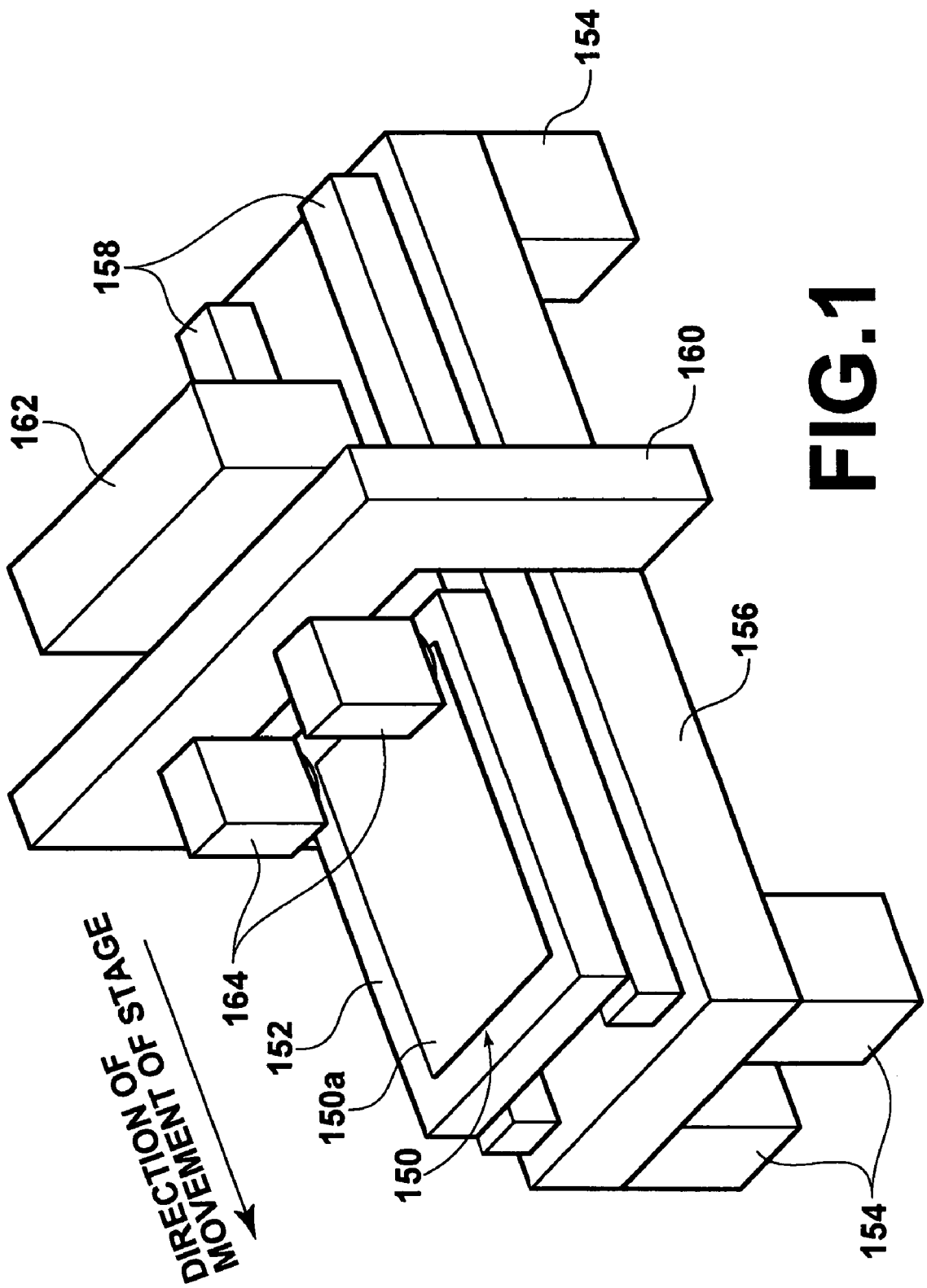

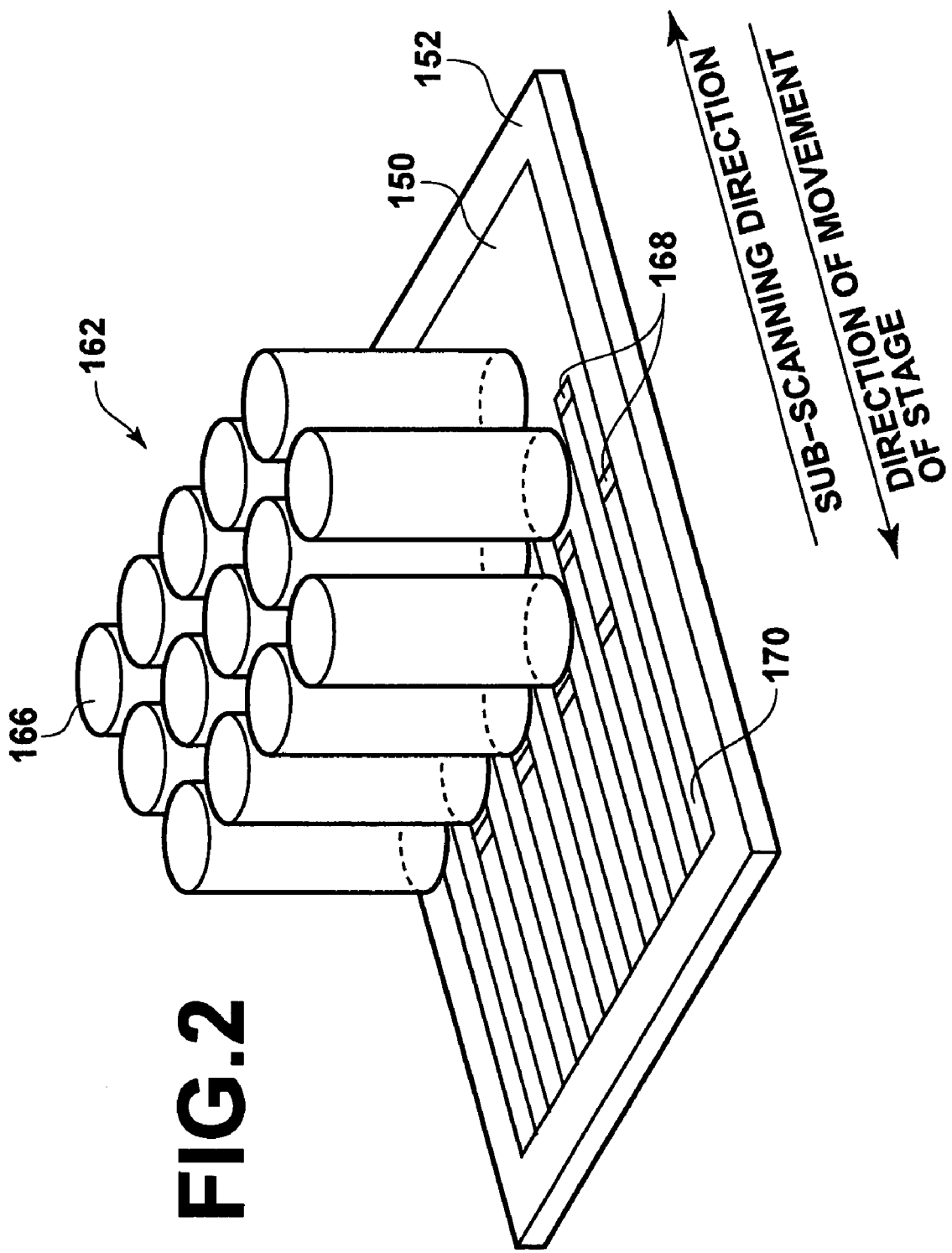

EXPOSED AREA

SUB-SCANNING DIRECTION
ONE CONSTANT LOW SPEED SCANNING(40mm/s)

m ROWS n COLUMNS

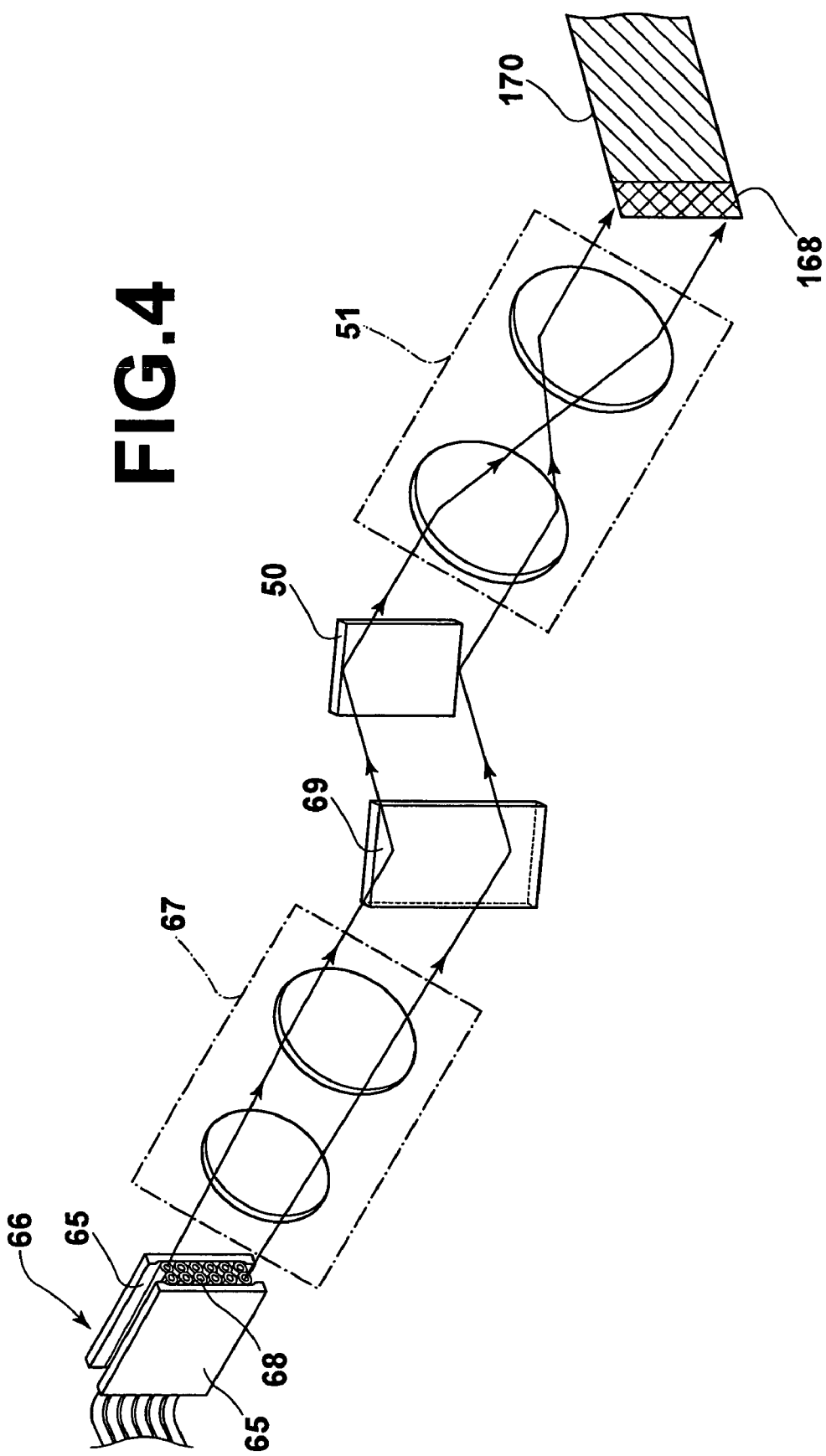

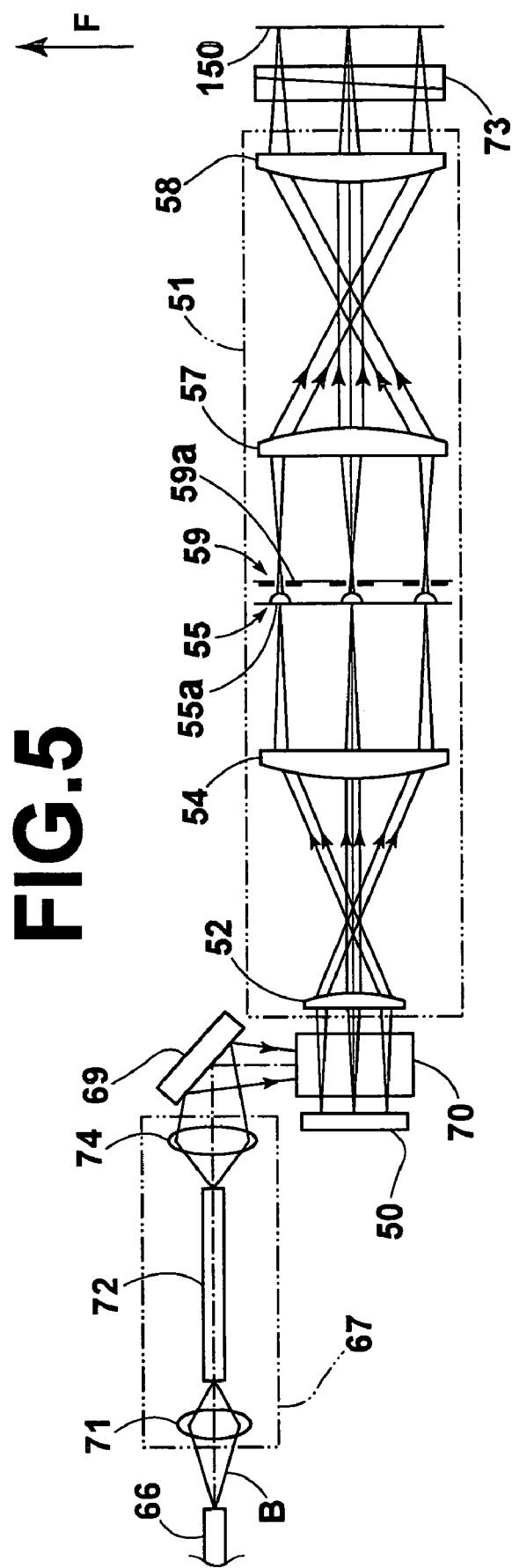

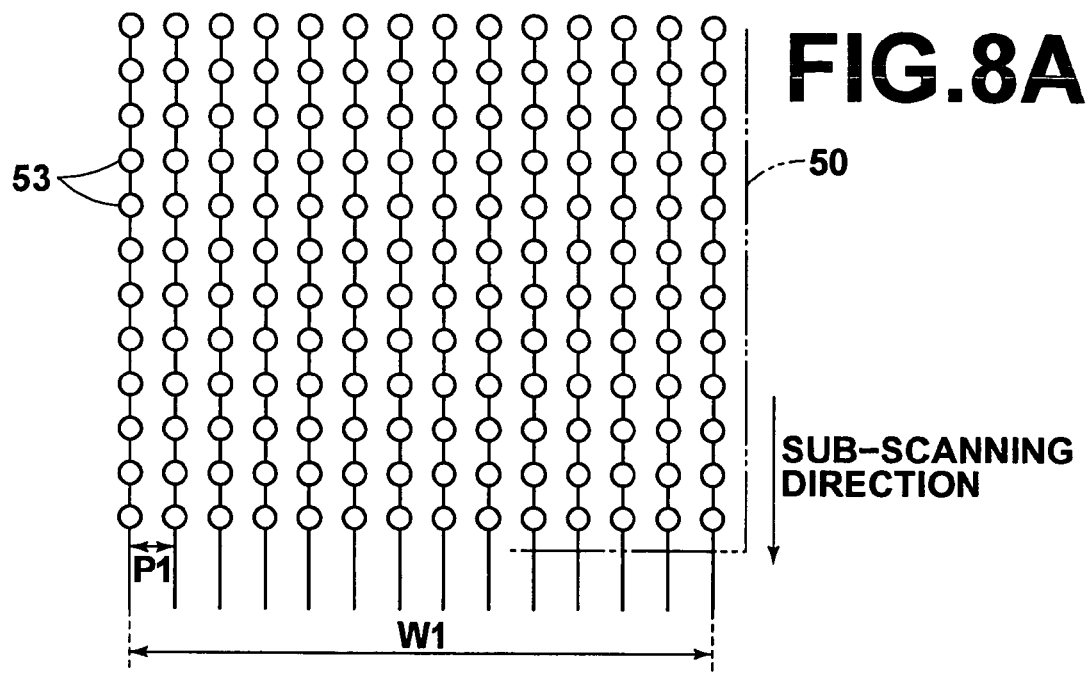
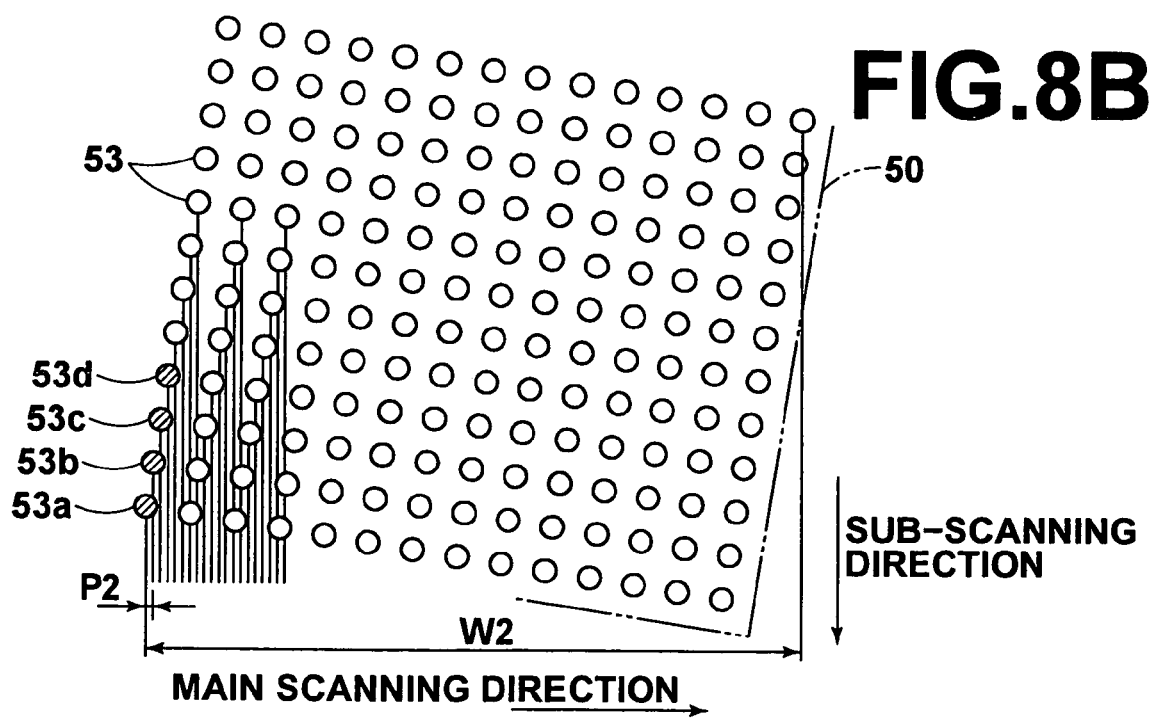

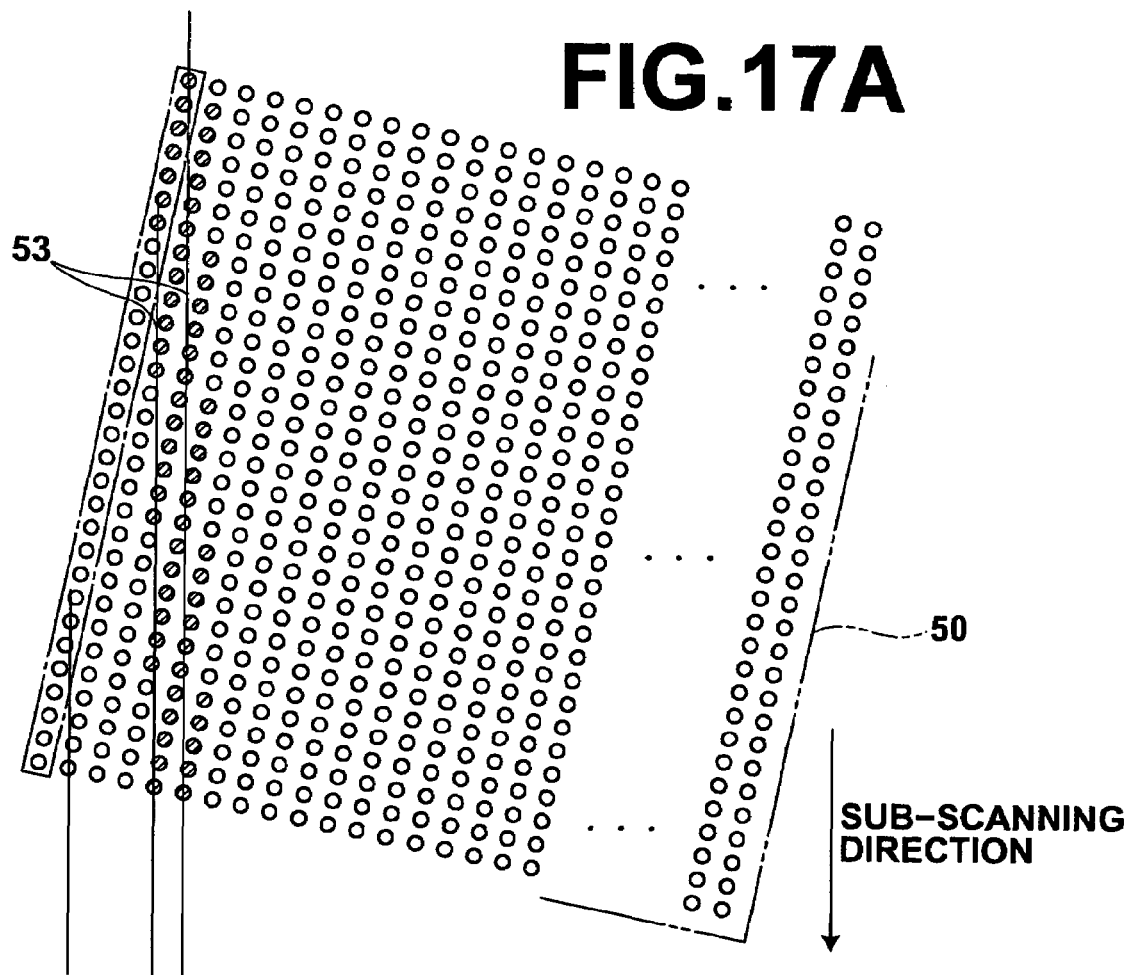

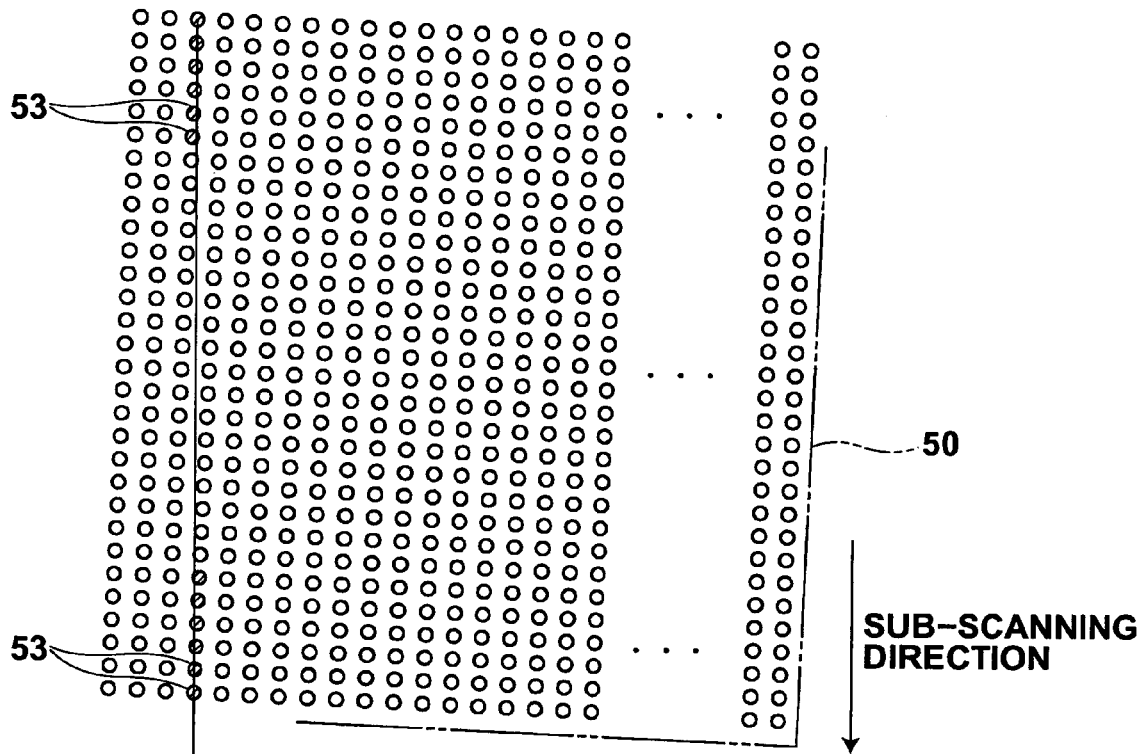
FIG. 18A
FIG. 18B
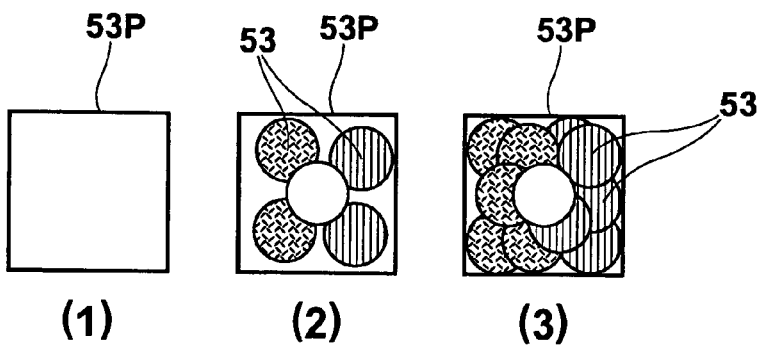
FIG. 18C

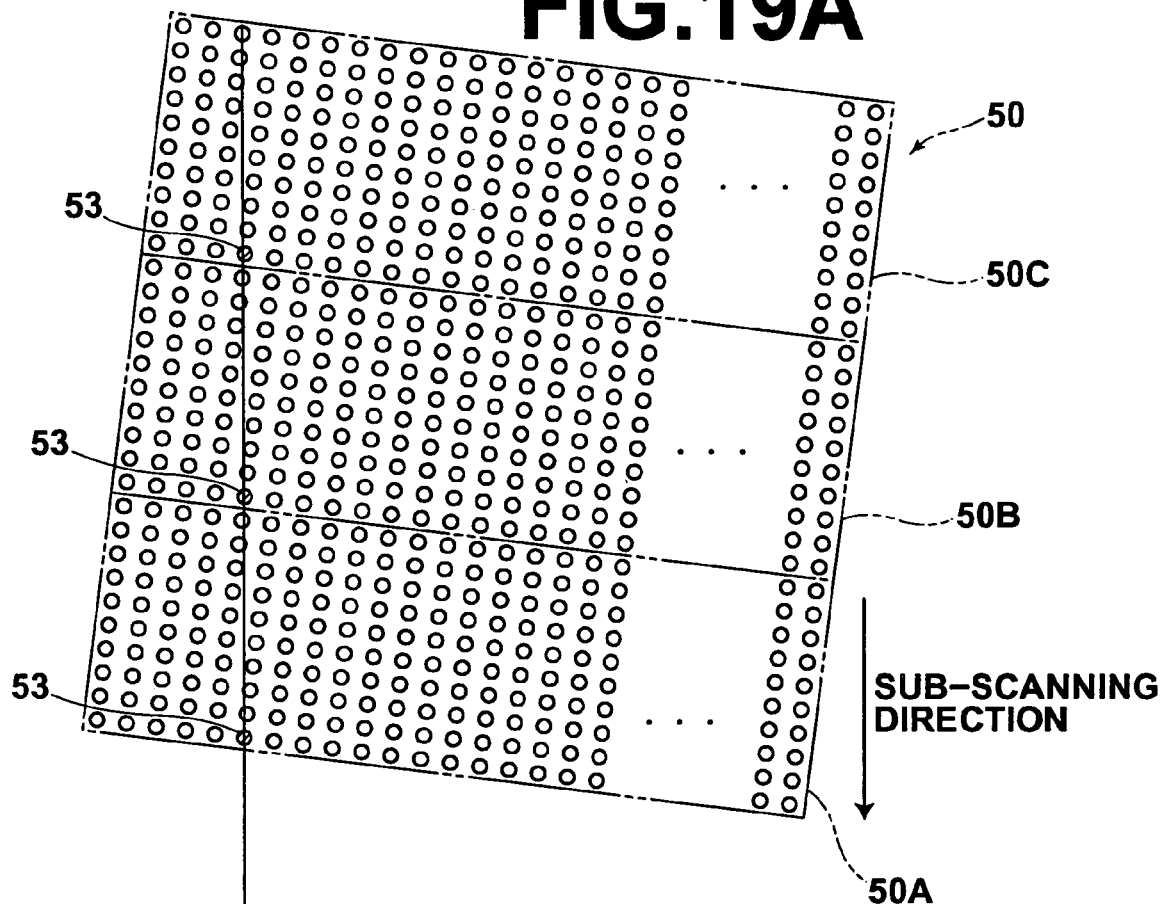
FIG.19A
FIG.19B
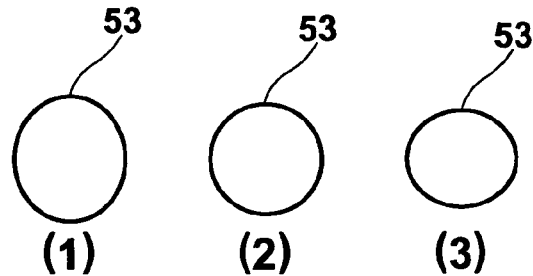
FIG.19C

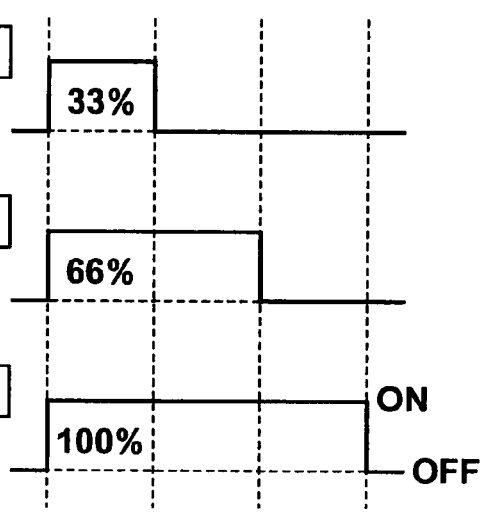
FIG.20A THIRD BLOCK
FIG.20B SECOND BLOCK
FIG.20C FIRST BLOCK

BOARD MATERIAL

EXPOSURE

RESIST SOLIDIFICATION (▨ SOLIDIFIED AREA)

DEVELOPMENT

SOLIDIFIED

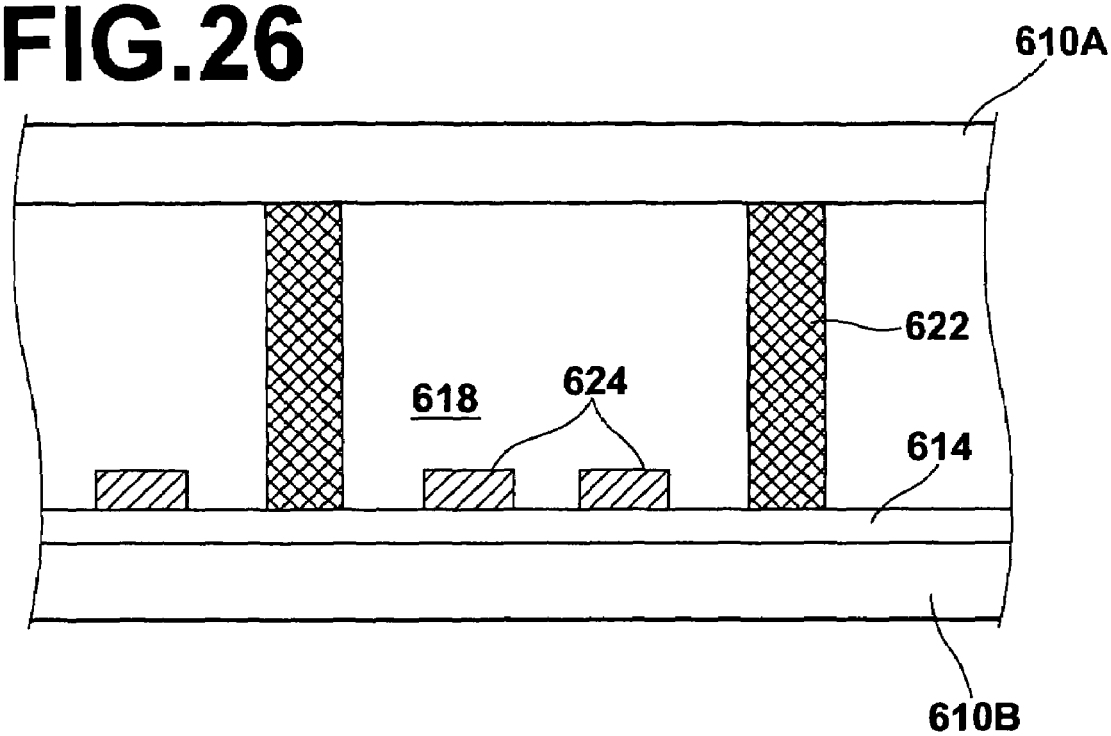
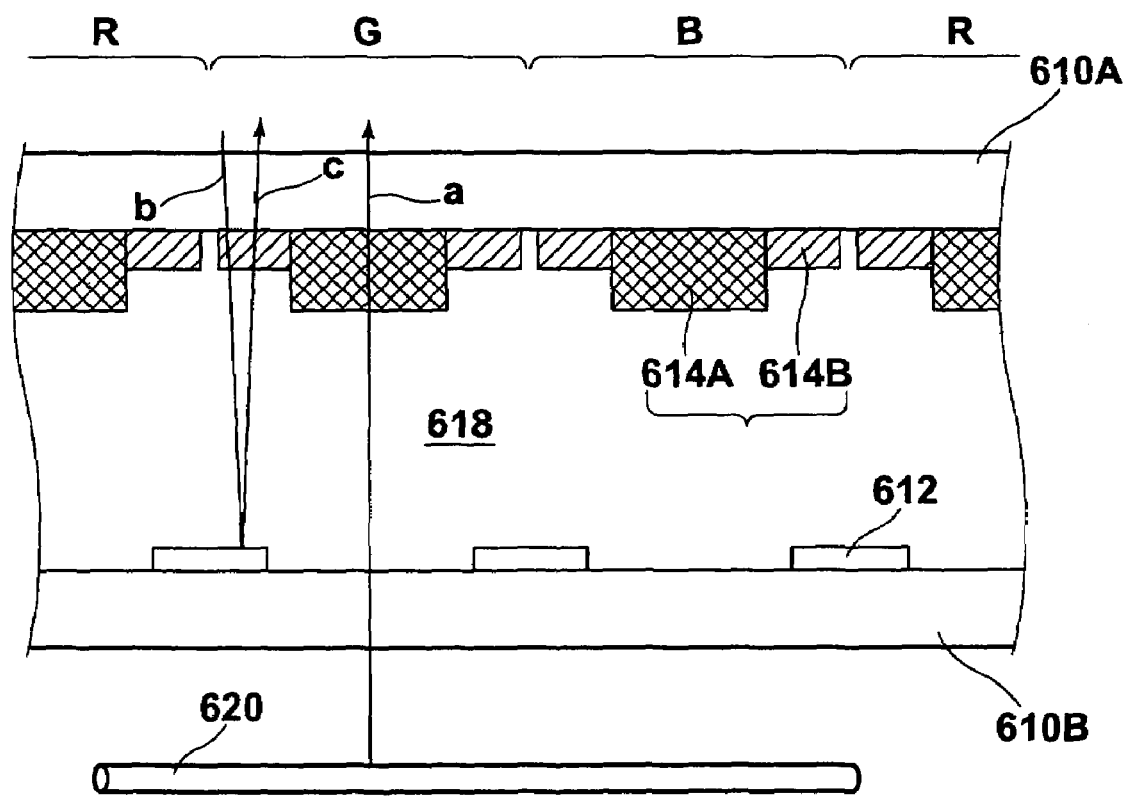

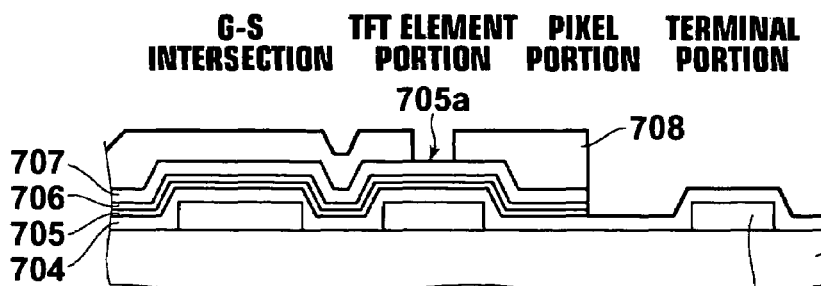
FIG.30G
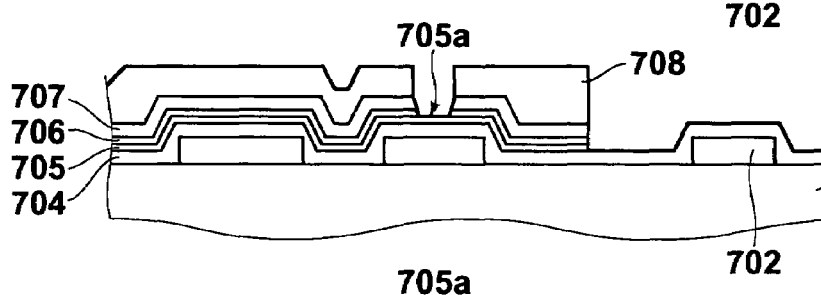
FIG.30H
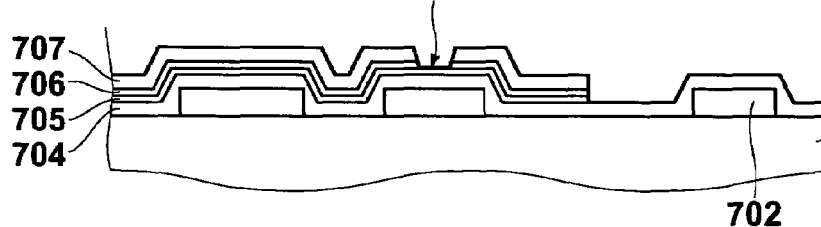
FIG.30I
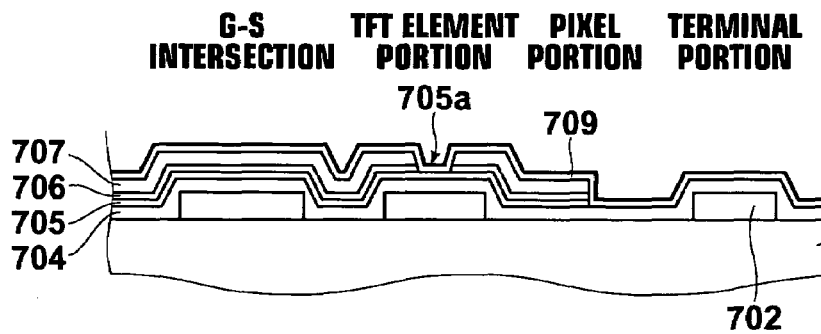
FIG.31J
FIG.31K
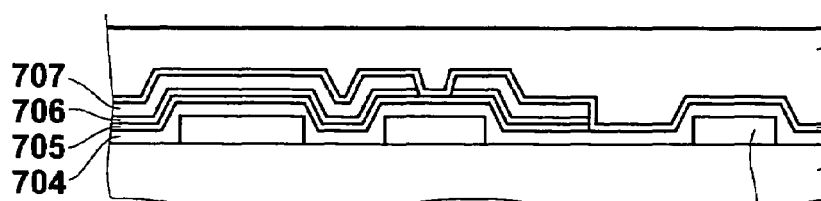
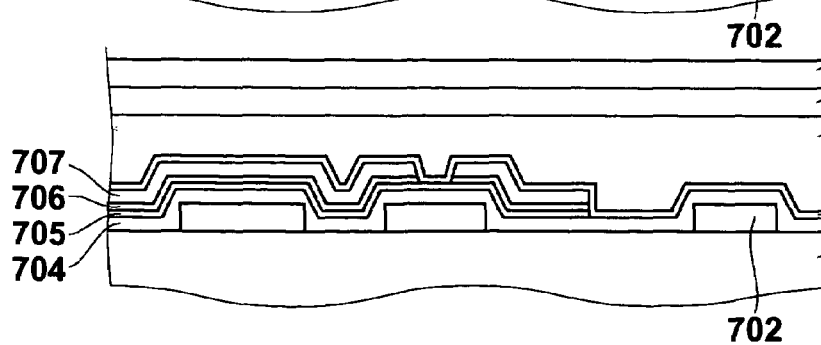
FIG.31L

EXPOSURE METHOD AND EXPOSURE SYSTEM

BACKGROUND OF THE INVENTION

1. Field of the Invention

This invention relates to an exposure method and system, and more particularly to an exposure method and system which project light modulated by a spatial light modulator element onto photoresist and expose the photoresist in a predetermined pattern.

2. Description of the Related Art

There have been in wide use a photolithography in production of, for instance, LCDs (liquid crystal display) or TFTs (thin film transistor). The photolithography in production of the TFTs basically comprises a step of coating a thin photoresist layer on a glass substrate having metal film or semiconductor film, a step of exposing the photoresist layer to light through a mask having a predetermined pattern and a step of developing the exposed photoresist layer to form a predetermined resist pattern.

In such a photolithography, reduction of processes is required in order to meet demands for reduction in the cost of LCDs. As an approach of this, there has been known an application of an intermediate tone exposure disclosed in Japanese Unexamined Patent Publication No. 2000-206571. In accordance with this exposure method, an exposure mask which can change the intensity of the exposure light in a plurality of stages in the surface of the exposure mask is employed, and after the development, a resist controlled in its thickness in a plurality of stages according to the pattern can be obtained.

Further, in Japanese Unexamined Patent Publication No. 2002-350897, there is disclosed a method of processing structural members on a TFT panel by the use of the photolithography wherein a plurality of structural members different in thickness are formed on the basis of the intermediate tone exposure.

Further, in "Sharp Technical Report", No 85, April 2003, pp. 34-35, there is disclosed a structure wherein micro irregularities are formed on the surface of a reflecting member which is formed on a LCD-TFT panel (as substrate material) and is thicker than other light-transmission members, in order to increase the light-scattering function of the reflecting member. Conventionally, such a structure is formed by once forming the reflecting member by the photolithography and then forming micro irregularities on the surface of the reflecting member.

In Japanese Unexamined Patent Publication No. 2004-062157, there is disclosed a method of forming optical circuits laminated on a circuit board in the direction of lamination on the basis of etching by a modulated light beam without use of a photo-mask. In this method, a multiple stages of optical circuits are formed by changing the exposure by the light beam.

The method disclosed in Japanese Unexamined Patent Publication No. 2000-206571 which employs the intermediate tone exposure can contribute to reduction of processes in the photolithography since, by this method, the process which have been done in a plurality of exposures in the usual method where a mask is employed can be done in one exposure.

However, a special mask having slit-like openings spaced at a very small distance from each other is employed in this method in order to realize an intermediate tone exposure. Whereas the pattern accuracy may be ±0.5 µm in the normal mask not for the intermediate tone exposure, a pattern accuracy of not larger than half of the value is required to the special mask for the intermediate tone exposure. Such a high definition mask is very expensive and accordingly, the exposure method employing such an expensive mask is naturally high in cost.

A problem similar to that described above exists in the method disclosed in Japanese Unexamined Patent Publication No. 2002-350897 where a plurality of structural members different in thickness are formed on the basis of the intermediate tone exposure.

Further, in a method where a member is first formed on the substrate material by the photolithography and micro irregularities are formed on the surface thereof as disclosed in "Sharp Technical Report", No 85, April 2003, pp. 34-35, there is a problem that the method is complicated in structure, which increases the cost of the product.

SUMMARY OF THE INVENTION

In view of the foregoing observations and description, the primary object of the present invention is to provide an exposure method and an exposure system which permit realization of an intermediate tone exposure of photosensitive material such as photoresist and the like at low cost.

In accordance with a first aspect of the present invention, there is provided an exposure method for projecting light modulated by a spatial light modulator element onto photosensitive material, thereby exposing the photosensitive material in a predetermined pattern, wherein the improvement comprises that the action of the spatial light modulator element is controlled so that the amount of the light projected onto the photosensitive material is changed in at least two stages according to the part of the photosensitive material, whereby a plurality of exposed areas different from each other in the amount of the light to which the area is exposed in at least two stages can be formed in the photosensitive material.

In the exposure method, it is preferred that the spatial light modulator element comprises an element which is formed by a plurality of two-dimensionally arranged pixels.

Further, in the exposure method, it is preferred that the spatial light modulator element comprises an element which is formed by a plurality of two-dimensionally arranged pixels and in which the exposure light is selectively turned on and off for each of the pixels, a sub-scanning to move the spatial light modulator element and the photosensitive material relatively to each other in one direction be effected, and the number of pixels which are continuous in the sub-scanning direction and project the exposure light onto the same part of the photosensitive material be controlled to change the amount of the exposure light to which the same part of the photosensitive material is exposed.

In this case, the exposure light from each of the pixels of the spatial light modulator element projected onto the same part of the photosensitive material may either completely overlap with their positions aligned with each other or only partly overlap with each other with their positions slightly shifted.

When the sub-scanning described above is effected in the exposure method of the present invention, it is preferred only a continuous part of the spatial light modulator element be used for modulation of the exposure light.

When the number of pixels projecting the exposure light is controlled in the manner described, it is preferred that dots of the light traveling through a plurality of pixels continuous in the sub-scanning direction be projected onto the photosensitive material, and the amount of the exposure light be changed by thinning the dots. When light modulated by the spatial light modulator element is projected onto the photosensitive material through an optical system, it is preferred that the dots be thinned in a predetermined pattern reflecting the optical characteristics of the optical system.

Further, when the dots are thinned, it is preferred that the dots which form an edge portion of the image be not thinned.

Further, in the exposure method of the present invention, the spatial light modulator element may comprise an element which is formed by a plurality of two-dimensionally arranged pixels and in which the exposure light is selectively turned on and off for each of the pixels, and the amount of the exposure light to which the photosensitive material is exposed may be changed by controlling the time for which each of the pixels of the spatial light modulator element is kept on.

In this case, a sub-scanning to move the spatial light modulator element and the photosensitive material relatively to each other in one direction as described above may be effected, or need not be effected. Also in this case, it is preferred only a continuous part of the spatial light modulator element be used for modulation of the exposure light.

It is preferred that a DMD (digital micro-mirror device) be used as the spatial light modulator element. The DMD comprises a number of micro mirrors which are two-dimensionally arranged on a semiconductor substrate such as of silicon and the angles of the reflecting surfaces of which can be changed according to a control signal. When such a DMD is employed, the photosensitive material can be exposed in a predetermined pattern since each of the micro mirrors can be moved between a position where the exposure light is reflected toward the photosensitive material and a position where the exposure light is reflected not toward the photosensitive material.

Further, it is preferred that the photosensitive material to be exposed by the exposure method of the present invention be photoresist formed on substrate material or material of a structural member provided on the substrate material to process the substrate material or the material of a structural member provided on the substrate material.

As the photoresist, two-layered photoresist comprising a layer of relatively high photosensitivity formed on the substrate material and a layer of relatively low photosensitivity formed on the layer of relatively high photosensitivity is suitably employed.

When such photoresist is to be exposed by the exposure method of the present invention, it is preferred that the ratio of the exposure when only the layer of relatively high photosensitivity is to be left to the exposure when the layer of relatively high photosensitivity and the layer of relatively low photosensitivity are both to be left be in the range of 0.01 to 0.5.

Further, when such photoresist is to be exposed by the exposure method of the present invention, two or more structural members can be formed by stepwise removing the parts of the photoresist which are different from each other in exposure.

When the substrate material is an LCD-TFT panel, the material of the structural member may be that for forming a TFT circuit.

Further, when the substrate material is conductive film, two-layered photosensitive material comprising a layer of relatively high photosensitivity formed on the substrate material and a layer of relatively low photosensitivity formed on the layer of relatively high photosensitivity is suitably employed.

It is preferred that the ratio of the exposure when only the layer of relatively high photosensitivity is to be left to the exposure when the layer of relatively high photosensitivity and the layer of relatively low photosensitivity are both to be left be in the range of 0.01 to 0.5.

Further, the photosensitive material to be exposed by the exposure method of the present invention may be a kind of material of a structural member having a part different in thickness in at least two stages and left on the substrate material.

More specifically, the substrate material may be an LCD-TFT panel, and the material of a structural member may be material of a reflecting member which has irregularities and is formed on the panel.

Further, the photosensitive material to be exposed by the exposure method of the present invention may be material of two or more structural members to be left on the substrate material.

It is preferred that such material of the structural members be two-layered photosensitive material comprising a layer of relatively high photosensitivity formed on the substrate material and a layer of relatively low photosensitivity formed on the layer of relatively high photosensitivity is suitably employed.

When such material of the structural members is to be exposed by the exposure method of the present invention, it is preferred that the ratio of the exposure when only the layer of relatively high photosensitivity is to be left to the exposure when the layer of relatively high photosensitivity and the layer of relatively low photosensitivity are both to be left be in the range of 0.01 to 0.5.

Further, more specifically, the substrate material may be an LCD-CF (color filter) panel, and in this case, the material of a structural member may be material of a rib member and/or material of a column.

When the substrate material is an LCD-CF (color filter) panel, the material of the structural member may be that for forming a light-transmitting RGB member or a light-reflecting RGB member as well.

In accordance with a second aspect of the present invention, there is provided an exposure system for projecting light modulated by a spatial light modulator element onto photosensitive material, thereby exposing the photosensitive material in a predetermined pattern, wherein the improvement comprises an exposure control means which controls the action of the spatial light modulator element so that the amount of the light projected onto the photosensitive material is changed in at least two stages according to the part of the photoresist, whereby a plurality of exposed areas different from each other in the amount of the light to which the area is exposed in at least two stages can be formed in the photosensitive material.

For example, it is preferred that the spatial light modulator element comprises an element which is formed by a plurality of two-dimensionally arranged pixels.

More specifically, it is preferred that the spatial light modulator element comprises an element which is formed by a plurality of two-dimensionally arranged pixels and in which the exposure light is selectively turned on and off for each of the pixels, a sub-scanning means which moves the spatial light modulator element and the photoresist relatively to each other in one direction be provided, and the exposure control means comprises a means which controls the number of pixels which are continuous in the sub-scanning direction and project the exposure light onto the same part of the photoresist.

It is preferred that the means which controls the number of pixels projecting the exposure light projects dots of the light traveling through a plurality of pixels continuous in the sub-scanning direction onto the photosensitive material, and changes the amount of the exposure light by thinning the dots.

When the exposure system of the present invention further comprises an optical system through which light modulated by the spatial light modulator element is projected onto the photosensitive material, it is preferred that the means which controls the number of pixels thins the dots in a predetermined pattern reflecting the optical characteristics of the optical system.

Further, it is preferred that the means which controls the number of pixels does not thin the dots which form an edge portion of the image.

When a mechanism to effect the sub-scanning described above in the exposure system of the present invention, it is preferred only a continuous part of the spatial light modulator element be used for modulation of the exposure light.

Further, in the exposure system of the present invention, it is preferred that the spatial light modulator element comprises an element which is formed by a plurality of two-dimensionally arranged pixels and in which the exposure light is selectively turned on and off for each of the pixels, and the exposure control means is formed by a means for controlling the time for which each of the pixels of the spatial light modulator element is kept on.

In this case, a sub-scanning to move the spatial light modulator element and the photoresist relatively to each other in one direction as described above may be effected, or need not be effected. Also in this case, it is preferred only a continuous part of the spatial light modulator element be used for modulation of the exposure light.

It is preferred that a DMD (digital micro-mirror device) be used as the spatial light modulator element.

In the exposure method of the present invention, since the action of the spatial light modulator element is controlled so that the amount of the light projected onto the photosensitive material such as photoresist or the material of the structural member is changed in at least two stages according to the part of the photosensitive material, whereby a plurality of exposed areas different from each other in the amount of the light to which the area is exposed in at least two stages can be formed in the photosensitive material, a high definition mask described above is not necessary and the exposure mask itself sometimes becomes unnecessary. Accordingly, in accordance with the exposure method of the present invention, an intermediate tone exposure of the photoresist can be realized at low cost.

When a plurality of exposed areas different from each other in the amount of the light to which the area is exposed can be formed in the photosensitive material, resist or the structural member which is controlled in its thickness in a plurality of stages according to the desired pattern can be formed through subsequent development of the photoresist.

When only a continuous part of the spatial light modulator element is used for modulation of the exposure light, the following effect can be obtained. That is, when the number of stages of the thickness of the resist is increased in order to reduce processes in the photolithography, it is necessary to make clearer the step between different thicknesses to stabilize the performance of the post processes such as the etching. In order to meet this requirement, it is necessary to expose the border of the pattern at finer resolution with the pixels overlapping each other.

However, when the photoresist is to be exposed at a fine resolution, the sub-scanning speed governed by the modulating speed of the spatial light modulator element becomes slower than the exposure speed governed by the necessary exposure power of the resist of each pixel, which gives rise to a problem that the sub-scanning speed cannot be increased though the exposure power is sufficient. Accordingly, by limiting the area of the spatial light modulator element to be used as described above, the control data transfer may be effected to the limited area of the spatial light modulator element and accordingly, the modulating speed of the spatial light modulator element can be increased, whereby the modulating speed of the spatial light modulator element can be brought into balance with the necessary exposure power and an optimal exposure system can be obtained.

The effect described above can be naturally obtained so long as the sub-scanning is effected even if the spatial light modulator element comprises an element which is formed by a plurality of two-dimensionally arranged pixels and in which the exposure light is on-off modulated for each of the pixels, and the amount of the exposure light to which the photoresist is exposed is changed by controlling the time for which each of the pixels of the spatial light modulator element is kept on.

Further, since the exposure system of the present invention is provided with an exposure control means which controls the action of the spatial light modulator element so that the amount of the light projected onto the photosensitive material is changed in at least two stages according to the part of the photosensitive material, the intermediate tone exposure of photoresist can be carried out at low cost.

BRIEF DESCRIPTION OF DRAWINGS

FIG. 1 is a perspective view showing an appearance of an exposure system in accordance with an embodiment of the present invention, FIG. 2 is a perspective view showing the scanner employed in the exposure system of FIG. 1, FIG. 4 is a perspective view schematically showing the arrangement of the exposure head employed in the exposure system of FIG. 1, FIG. 5 is a cross-sectional view of the exposure head, FIGS. 8A and 8B are plan views for comparing the arrangement of the exposure beam and the scanning lines in the case where the DMD is inclined and in the case where the DMD is not inclined, FIG. 8C is a view for illustrating the overlap of the exposure beam spots, FIGS. 17A and 17B are views illustrating technique of changing the exposure, FIGS. 18A to 18C are views illustrating another technique of changing the exposure, FIGS. 19A to 19C are views illustrating still another technique of changing the exposure, FIGS. 20A to 20C are views for illustrating control of the on-time of the DMD in order to change the exposure, FIG. 21 are views showing the steps of the exposure method in accordance with an embodiment of the present invention, FIG. 26 is a schematic side cross-sectional view showing a part of an LCD-CF panel to which the exposure method of the present invention is applied, FIG. 27 is a schematic side cross-sectional view showing another part of an LCD-CF panel to which the exposure method of the present invention is applied, FIGS. 30G to 30I are views showing the step of producing the active matrix substrate, FIGS. 31J to 31L are views showing the step of producing the active matrix substrate.

DESCRIPTION OF THE PREFEERD EMBODIMENT

Figure 3A:
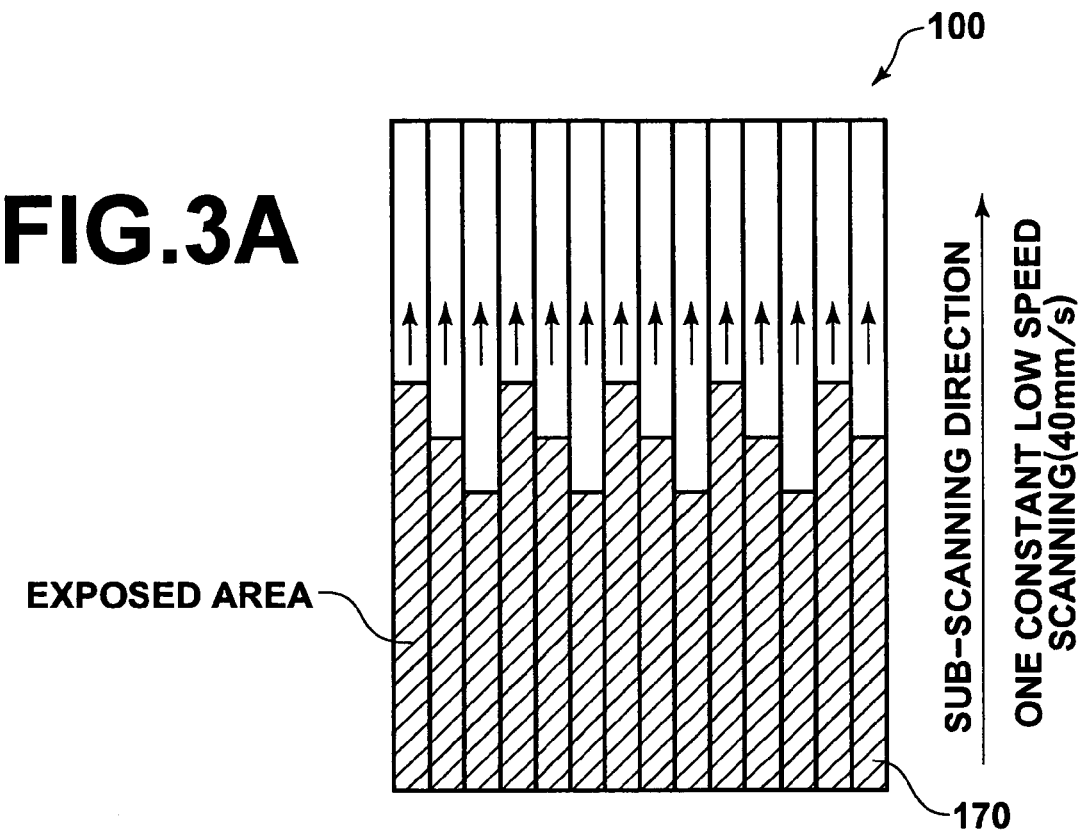
FIG. 3A is a plan view showing the areas which have been exposed formed in the photoresist.

Exposure systems in accordance with embodiments of the present invention will be described with reference to the drawings, hereinbelow.

In FIG. 1, an exposure system in accordance with an embodiment of the present invention is provided with a plate-like movable stage 152 which attracts a glass substrate 150 coated with photoresist 150a against its surface, thereby holding the glass substrate 150. A thick plate-like table 156 is supported by four legs 154 and a pair of guides 158 extends in the direction of movement of the movable stage 152 on the upper surface of the table 156. The movable stage 152 is disposed so that its longitudinal direction is directed toward the direction of movement of the movable stage 152 and is movable back and forth along the guides 158. The exposure system is further provided with a stage drive unit 304 (FIG. 15) to be described later which drives the movable stage 152 along the guides 158 as a sub-scanning means.

A substantially U-shaped gate 160 extends across the path of movement of the movable stage 152 at the center of the table 156. The opposite ends of the gate 160 are respectively fixed to the corresponding side surfaces of the table 156. On one side of the gate 160, a scanner 162 is provided, and on the other side of the gate 160, a plurality of (e.g., two) sensors 164 for detecting the leading end and the trailing end of the glass substrate 150 and a pattern on the substrate 150 are provided. The scanner 162 and the sensors 164 are mounted on the gate 160 and fixed above the path of movement of the movable stage 152. Further, the scanner 162 and the sensors 164 are connected to a controller (not shown) for controlling them.

Figure 3B:
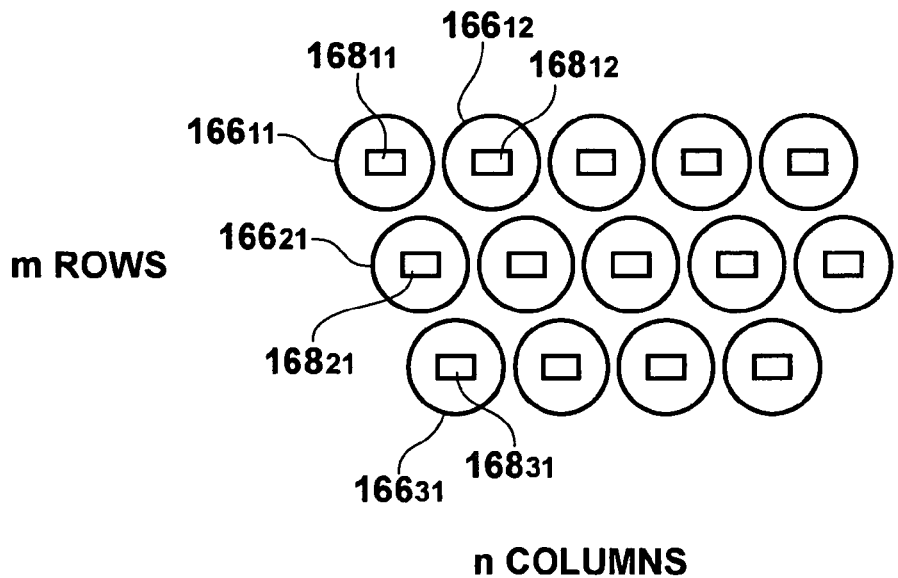
FIG. 3B is a view showing the arrangement of the areas exposed by the exposure heads.

As shown in FIGS. 2 and 3B, the scanner 162 is provided with a plurality of (e.g., 14) exposure heads 166 which are substantially arranged in a matrix of m rows×n columns (e.g., 3 rows×5 columns). In this example, 4 exposure heads 166 are provided along the third row taking into account the width of the glass substrate 150. The area exposed by the exposure head provided on the m-th row, n-th column is referred to as the "exposure area $168_{mn}$".

As shown in FIGS. 3A and 3B, so that strip-like exposed areas 170 are contiguously arranged side by side in a direction perpendicular to the sub-scanning direction, the exposure heads 166 on a given row are disposed shifted with respect to the adjacent exposure heads 166 on the adjacent rows in the direction of arrangement by a predetermined distance (a natural number of times the longer side of the exposure area: twice in this particular example). With this arrangement, the area between the exposure area $168_{11}$ and the exposure area $168_{12}$ on the first row which cannot be exposed can be exposed by the exposure area $168_{21}$ on the second row and the exposure area $168_{31}$ on the third row.

As shown in FIGS. 4 and 5, each of the exposure heads $166_{11}$ to $166_{mn}$ is provided with a digital micro mirror device (DMD) 50 (Texas Instruments: United States) as a spatial light modulator element which modulates the entering light beam by the pixels according to the image data. The DMD 50 is connected to a controller 302 (to be described later with reference to FIG. 15) comprising a data processing portion and a mirror drive portion. In the data processing portion of the controller 302, control signals for driving each of the micro mirrors in an area to be controlled by the DMD 50 are generated exposure head by exposure head on the basis of the input image data. The area to be controlled will be described later. In the mirror drive portion, each of the micro mirrors of the DMD 50 for the corresponding exposure head 166 is controlled in the angle of its reflecting surface on the basis of the control signals generated in the image data processing portion. The control of the angle of the reflecting surface of each micro mirror will be described later.

On the light incident side of the DMD 50, a fiber array light source 66 provided with a laser beam emitting portion in which a plurality of light exit ends (light emitting points) of optical fibers are arranged in a row along a direction corresponding a longer side of the exposure area 168, a lens system 67 which corrects laser beams emitted from the fiber array light source 66 and converges them on the DMD 50 and a mirror 69 which reflects toward the DMD 50 the light passing through the lens system 67 are disposed in this order. In FIG. 4, the lens system 67 is schematically shown.

As shown in detail in FIG. 5, the lens system 67 comprises a collective lens 71 which collects the laser beam B emitted from the fiber array light source 66 as illumination light, a rod-like optical integrator (will be referred to as "rod integrator", hereinbelow) 72 inserted into the optical path of light passing through the collective lens 71, and an imaging lens 74 which is disposed downstream of the rod integrator 72, or the side of the mirror 69 of the rod integrator 72. The rod integrator 72 causes light emitted from the fiber array light source 66 to impinge upon the DMD 50 as a light bundle which is substantially parallel light and is uniform in intensity in a given beam cross-section. The shape and operation of the rod integrator 72 will be described in detail later.

The laser beam B emitted from the lens system 67 is reflected by the mirror 69 to impinge upon the DMD 50 through a TIR (total internal reflection) prism 70. The TIR prism 70 is abbreviated in FIG. 4.

On the light reflection side of the DMD 50, an imaging optical system 51 for imaging the laser beam B reflected by the DMD 50 on the photoresist 150*a*. As shown in detail in FIG. 5 (schematically shown in FIG. 4), the imaging optical system 51 comprises a first imaging optical system consisting of lens systems 52 and 54, a second imaging optical system consisting of lens systems 57 and 58, and a micro lens array 55 and a mask plate 59 inserted between the first and second imaging optical systems.

The micro lens array 55 comprises a number of two-dimensionally arranged micro lenses 55*a* each corresponding one pixel of the DMD 50. Since 1024×256 micro mirrors of the DMD 50 out of 1024×768 micro mirrors of the DMD 50 are only driven, the micro lenses 55*a* are arranged in 1024 pieces×256 columns. The micro lenses 55*a* are arranged at intervals of 41 μm in both the longitudinal and transverse directions. Each of the micro lenses 55*a* may be, for instance, 0.19 mm in focal length and 0.11 in numerical aperture, and formed of optical glass BF7. The shape of each micro lens 55*a* will be described in detail later. The beam diameter of the laser beam B in the position of each micro lens 55*a* is 3.4 μm.

The mask plate 59 comprises a light-shielding mask 59*a* formed on a transparent plate, the light-shielding mask 59*a* having a number of apertures each corresponding to one of the micro lenses 55*a* of the micro lens array 55 and is disposed near a focus of the micro lenses 55*a*. By the mask plate 59, off-light of the DMD 50 and/or stray light from the micro mirrors 62 can be cut.

The first imaging optical system enlarges the image by the DMD 50 to the size of three times and images it on the micro lens array 55. The second imaging optical system enlarges the image which has traveled through the micro lens array 55 to the size of 1.6 times and images and projects it on the photoresist 150*a* on the glass substrate 150. That is, an image which is 4.8 times the image by the DMD 50 in size is imaged and projected on the photoresist 150*a*.

In this particular embodiment, a prism pair 73 is disposed between the second imaging optical system and the glass substrate 150. By moving up and down the prism pair 73 in FIG. 5, the image can be brought into focus on the photoresist 150*a* on the glass substrate 150. The glass substrate 150 is fed in the direction of arrow F in FIG. 5 (sub-scanning).

Figure 6:
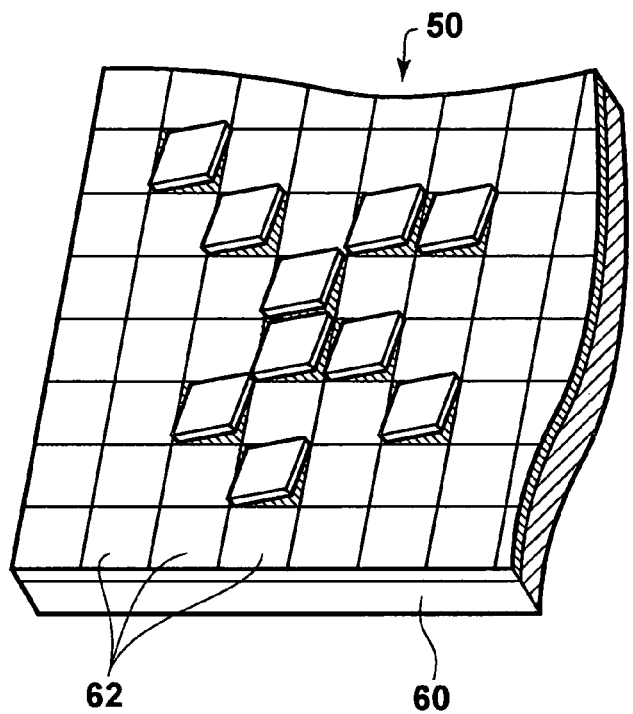
FIG. 6 is a fragmentary enlarged view of a digital micro mirror device (DMD)

As shown in FIG. 6, the DMD 50 is a mirror device comprising a number of (e.g., 1024×768) micro mirrors 62 which form pixels and are arranged on an SRAM cell (memory cell) 60 in a pattern of lattice. In each of the pixels, a micro mirror 62 disposed in the uppermost position is supported by a post. The surface of each micro mirror 62 is coated by deposition with material such as aluminum which is high in reflectance. The reflectance of the micro mirrors 62 is not lower than 90%, and the micro mirrors 62 are arranged at pitches of, for instance, 13.7 μm in both the longitudinal and transverse directions. The SRAM cell 60 just below the micro mirrors 62 is of CMOS of a silicon gate which is made by a production line of usual semiconductor memories and is provided with the posts including hinges and yokes. The DMD 50 is monolithic in total.

Figure 7A:
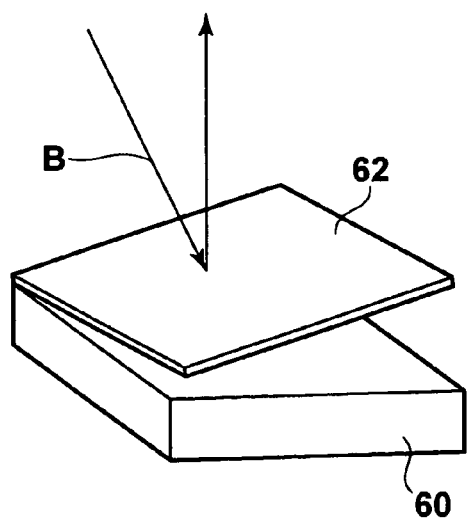
FIGS. 7A and 7B are views for illustrating action of the DMD.
Figure 7B:
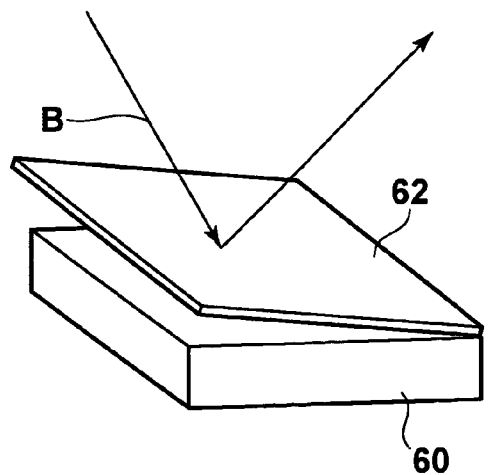

When a digital signal is written in the SRAM cell 60 in the DMD 50, the micro mirror 62 supported by the post is inclined about a diagonal line within ±α° (e.g., ±12°) with respect to the substrate of the DMD 50. FIG. 7A shows a state where the micro mirror 62 is turned on and inclined by +α° and FIG. 7B shows a state where the micro mirror 62 is turned off and inclined by −α°. By controlling the inclination of the micro mirrors 62 of the DMD 50 as shown in FIG. 6 according to the image signal, the laser beam B impinging upon the DMD 50 is reflected in the direction governed by the inclination of the micro mirrors 62.

FIG. 6 shows a part of the DMD 50 in an enlarged scale and shows an example of the state where the micro mirrors 62 are controlled to +α° or −α°. The respective micro mirrors 62 are turned on and off under the control of the above mentioned controller 302 connected to the DMD 50. A light absorber (not shown) is disposed in the optical path of light reflected by the micro mirror 62 in the off state.

Further, it is preferred the DMD 50 be slightly inclined so that its shorter side is at a predetermined angle θ (e.g., 0.1 to 5°) to the sub-scanning direction. FIG. 8A shows the scanning locus of the image of light (exposure beam) 53 reflected by each micro mirror 55*a* when the DMD 50 is not inclined, whereas FIG. 8B shows the scanning locus of the exposure beam 53 when the DMD 50 is inclined.

The DMD 50 comprises a number of (e.g., 756) micro-mirror rows, each formed of a number of (e.g., 1024) micro mirrors arranged in the longitudinal direction, arranged in the transverse direction. When the DMD 50 is inclined as shown in FIG. 8B, the pitches P1 of the scanning loci of the exposure beams 53 reflected by the micro mirrors (the scanning lines) becomes narrower than those P2 when the DMD 50 is not inclined as shown in FIG. 8A, whereby the resolution can be greatly improved. Since the angle of inclination of the DMD 50 is very small, the scanning width W$_2$ when the DMD 50 is inclined is substantially the same as that W$_1$ when the DMD 50 is not inclined.

Further, the micro mirrors 62 are arranged so that exposure beam spots adjacent to each other in the sub-scanning direction are slightly (e.g. by about 0.1 to 0.5 μm) shifted to each other in the main scanning direction. Since the diameter of the exposure spots is about 5 to 20 μm and is larger than the space between exposure spots, the photoresist 150*a* is exposed multiple times (multiple exposure) with two or more of pixels of the DMD 50 partly overlapping.

By virtue of the multiple exposure, the exposure position can be finely controlled and high definition exposure can be realized. Further, the connections between adjacent exposure heads arranged in the main scanning direction can be smoothly connected by exposure position control by a very small amount.

The same effect can be obtained by staggering the micro mirror rows in a direction perpendicular to the sub-scanning line in place of inclining the DMD 50.

Figure 9A:
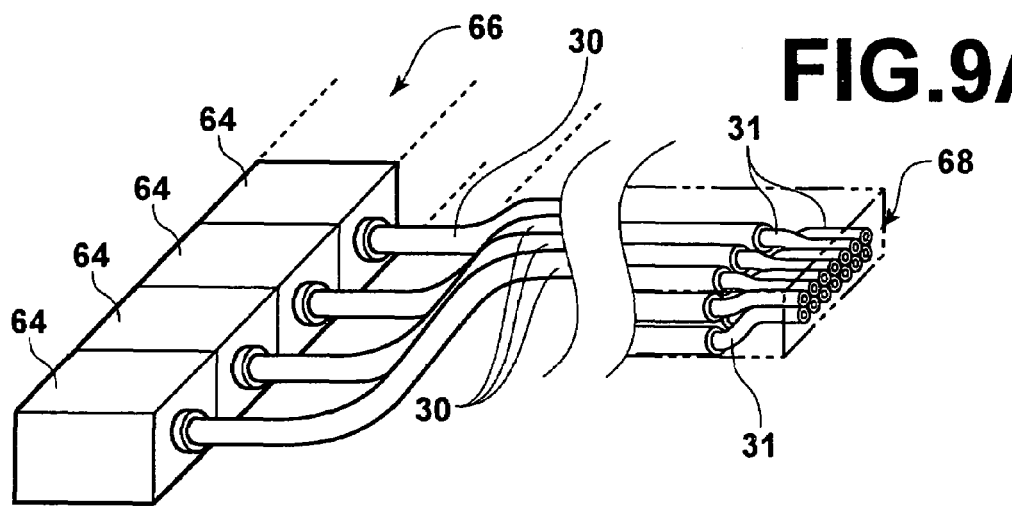
FIG. 9A is a perspective view showing the arrangement of the fiber array light source.

The fiber array light source 66 is provided with a plurality of (e.g., 14) laser modules 64 and a multi-mode optical fiber 30 is connected to each of the laser modules 64 at one end thereof as shown in FIG. 9A. An optical fiber 31 which is equal to the multi-mode optical fiber 30 in core diameter and is smaller than the multi-mode optical fiber 30 in clad diameter is coupled to the other end of the multi-mode optical fiber 30. As shown in detail in FIG. 9B, the end portions opposite to the optical fibers 30 of the seven optical fibers 31 are arranged in the main scanning direction perpendicular to the sub-scanning direction to form a laser beam emitting half, and two laser beam emitting halves are arranged side by side to form a laser beam emitting portion 68.

Figure 9B:
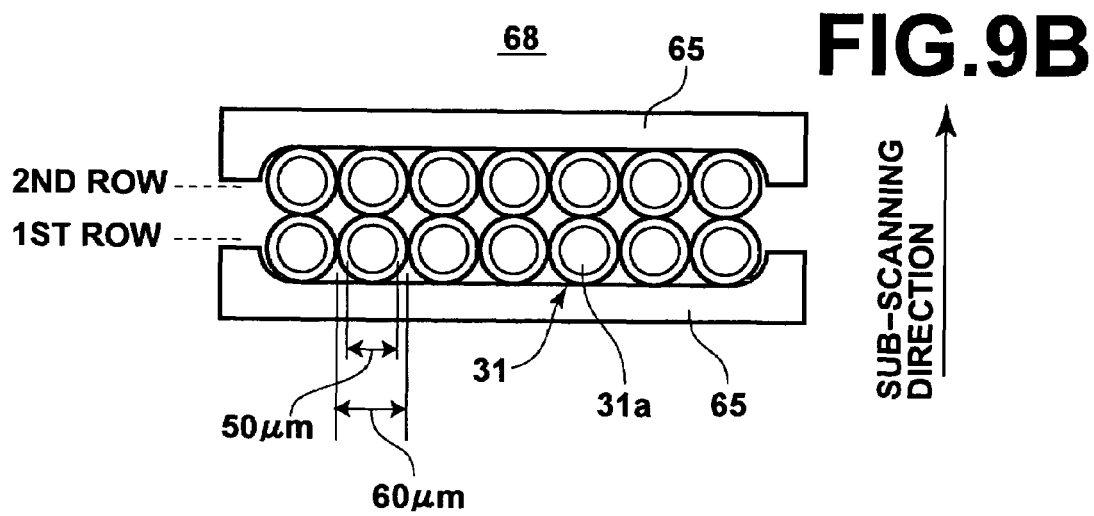
FIG. 9B is a front elevation showing the arrangement of the light emitting points in the laser exit face of the fiber array light source.

The laser beam emitting portion 68 formed by the end portions of the multi-mode optical fibers 31 is sandwiched and fixed by a pair of support plates 65 having flat surfaces as shown in FIG. 9B. It is preferred that the light exit end face of the multi-mode optical fiber 31 be provided with a transparent protective plate such as of glass for the protection thereof. The light exit end face of the multi-mode optical fiber 31 is apt to collect dust and to thereby deteriorate due to a high light density. However, by providing the protective plate described above, dust can be prevented from adhering to the end face and deterioration of the end face can be slowed.

Figure 10:
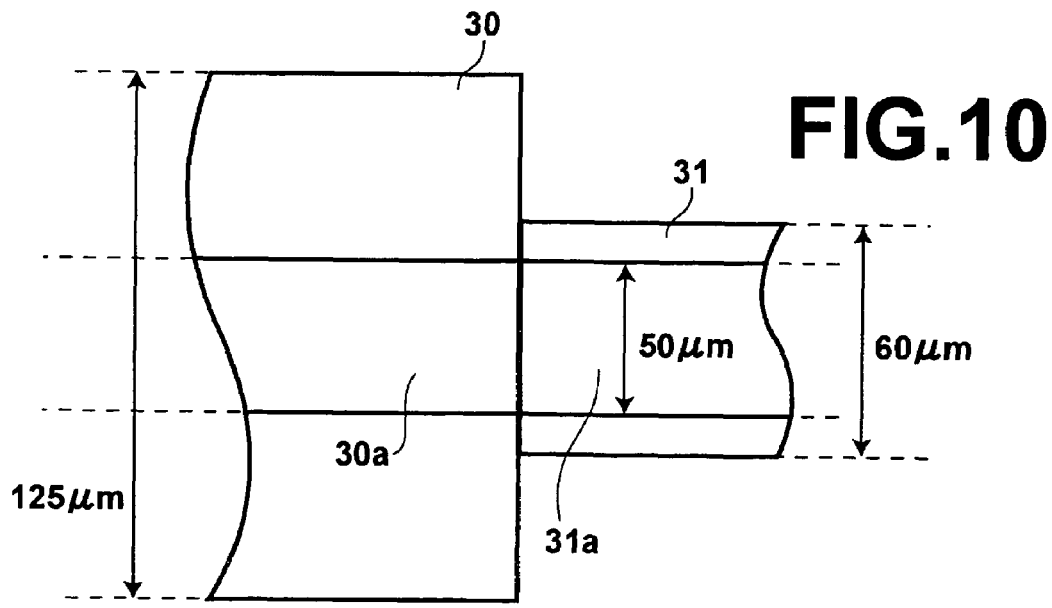
FIG. 10 is a view showing the arrangement of the multi-mode optical fiber.

As shown in FIG. 10, in this particular embodiment, the optical fiber 31 which is 1 to 30 cm in length and smaller in core diameter is coaxially coupled to the leading end portion of the multi-mode optical fiber 30 which is larger in core diameter. The optical fibers 30 and 31 are coupled by fusing the light inlet end face of the optical fiber 31 to the light exit end face of the optical fiber 30 with the core axes of the fibers 30 and 31 aligned with each other. As described above, the diameter of the core 31a of the optical fiber 31 is equal to the diameter of the core 30a of the optical fiber 30.

As the multi-mode optical fiber 30 and the optical fiber 31, any of a step index optical fiber, a graded index optical fiber and a composite optical fiber maybe employed. For example, a step index optical fiber available from MITSUBISHI CABLE INDUSTRIES LTD. can be employed. In this particular embodiment, the multi-mode optical fiber 30 and the optical fiber 31 are step index optical fibers, and the former optical fiber is 125 μm in clad diameter, 50 μm in core diameter, 0.2 in NA, and not lower than 99.5% in transmissivity of the coating on the light incident end face, while the latter optical fiber is 60 μm in clad diameter, 50 μm in core diameter, and 0.2 in NA.

The clad diameter of the optical fiber 31 need not be limited to 60 μm. Many of the optical fibers employed in the conventional fiber light sources are 125 μm in clad diameter. However, since as the clad diameter is reduced, the focal depth increases, the clad diameter of the multi-mode optical fiber is preferably not larger than 80 μm, more preferably not larger than 60 μm and most preferably not larger than 40 μm. Whereas since the core diameter should be at least 3 to 4 μm, the clad diameter of the optical fiber 31 is preferably not smaller than 10 μm.

Figure 11:
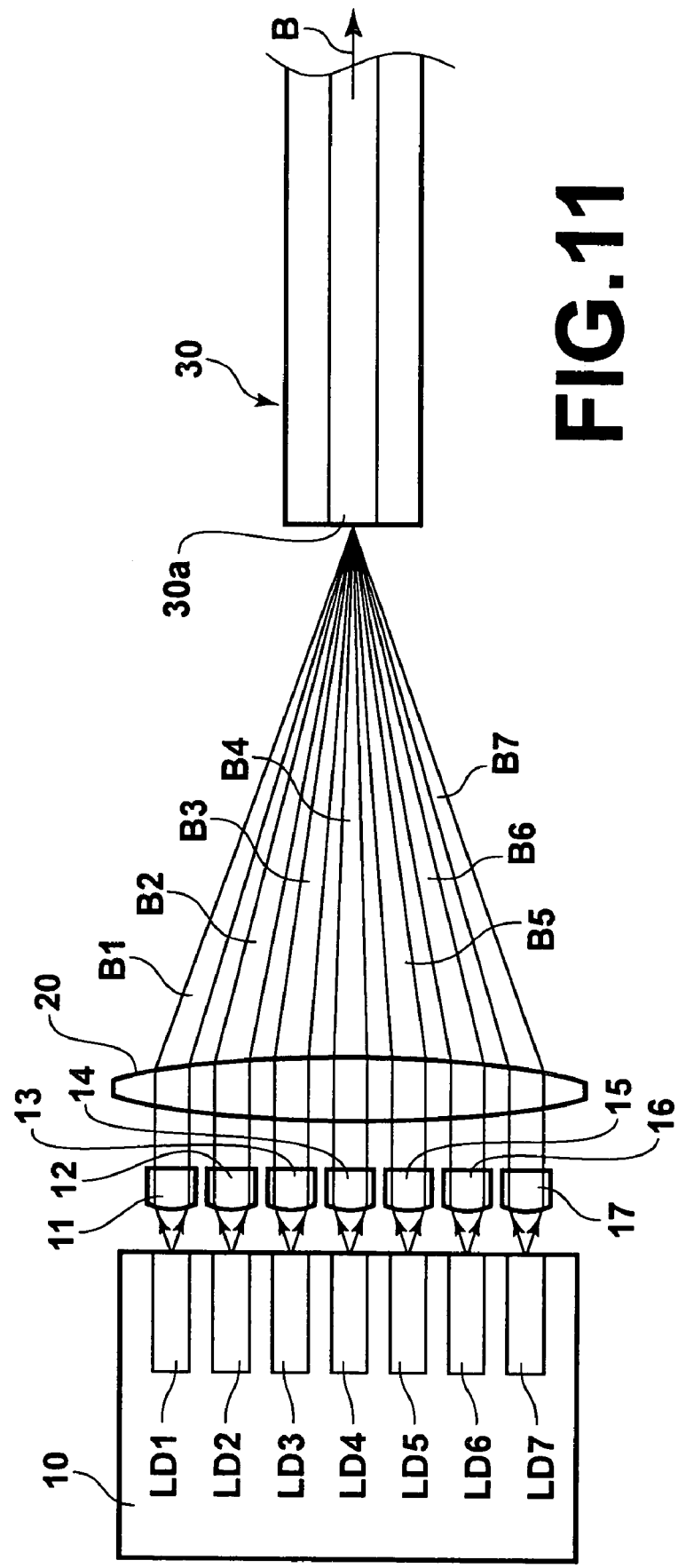
FIG. 11 is a plan view showing the arrangement of the wave combined laser.

The laser module 64 is formed by a wave combined laser (a fiber optical source) shown in FIG. 11. The wavelength combined laser comprises a plurality of (e.g., 7) GaN semi-conductor laser chips LD1, LD2, LD3, LD4, LD5, LD6, and LD7 which are of a transverse multi-mode or a single mode and are arranged and fixed on a heat block 10, collimator lenses 11, 12, 13, 14, 15, 16 and 17 provided corresponding to each of the GaN semi-conductor lasers LD1 to LD7, a collective lens 20 and a multi-mode optical fiber 30. The number of the semi-conductor lasers need not be limited to seven but may be other numbers. A collimator lens array where collimator lenses are integrated may be employed in place of the 7 collimator lenses 11 to 17.

All the GaN semi-conductor lasers LD1 to LD7 are the same in oscillation wavelength (e.g., 405 nm) and in maximum output power (e.g., about 100 mW in multi-mode lasers and about 50 mW in single mode lasers). The GaN semi-conductor lasers LD1 to LD7 may oscillate at a wavelength other than 405 nm in the range of 350 nm to 450 nm.

Figure 12:
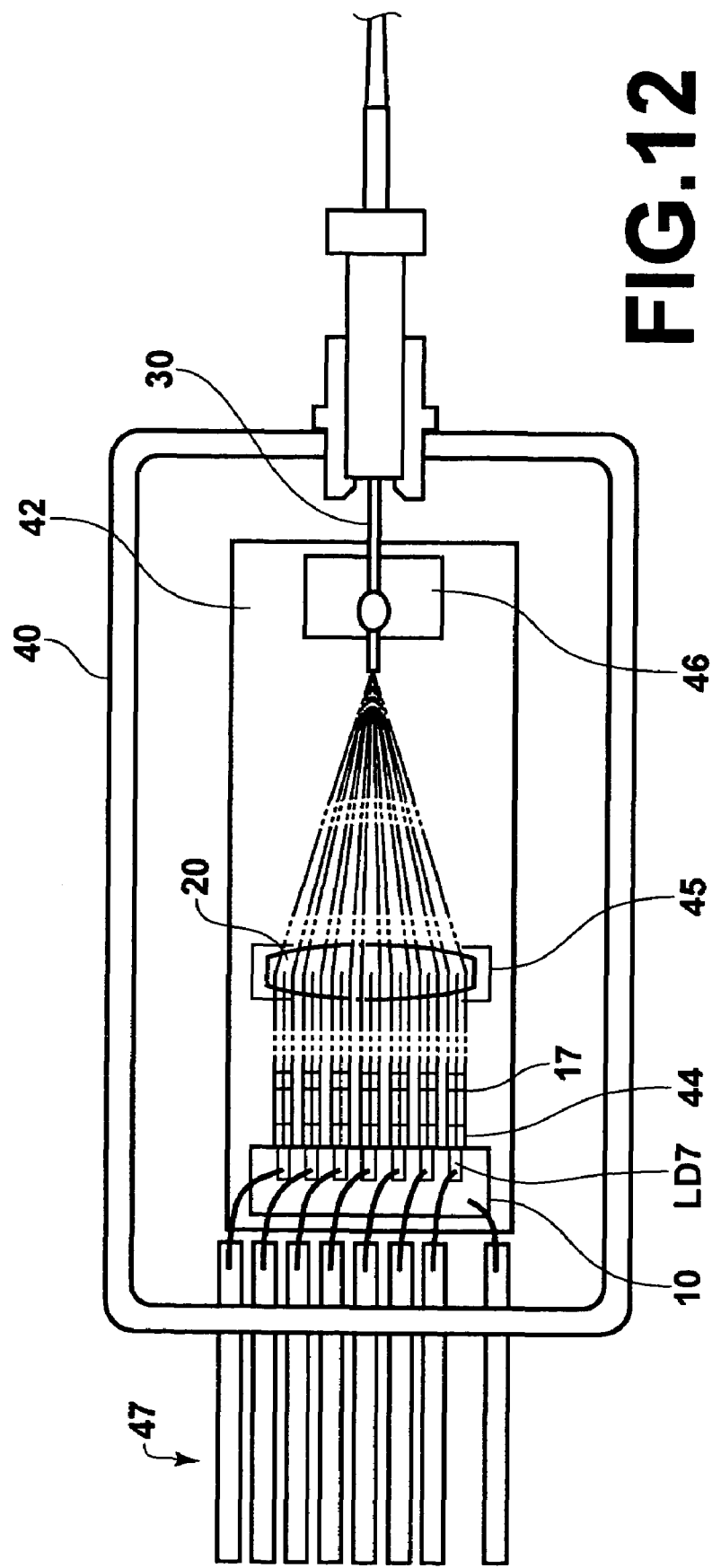
FIG. 12 is a plan view showing the arrangement of the laser module.
Figure 13:
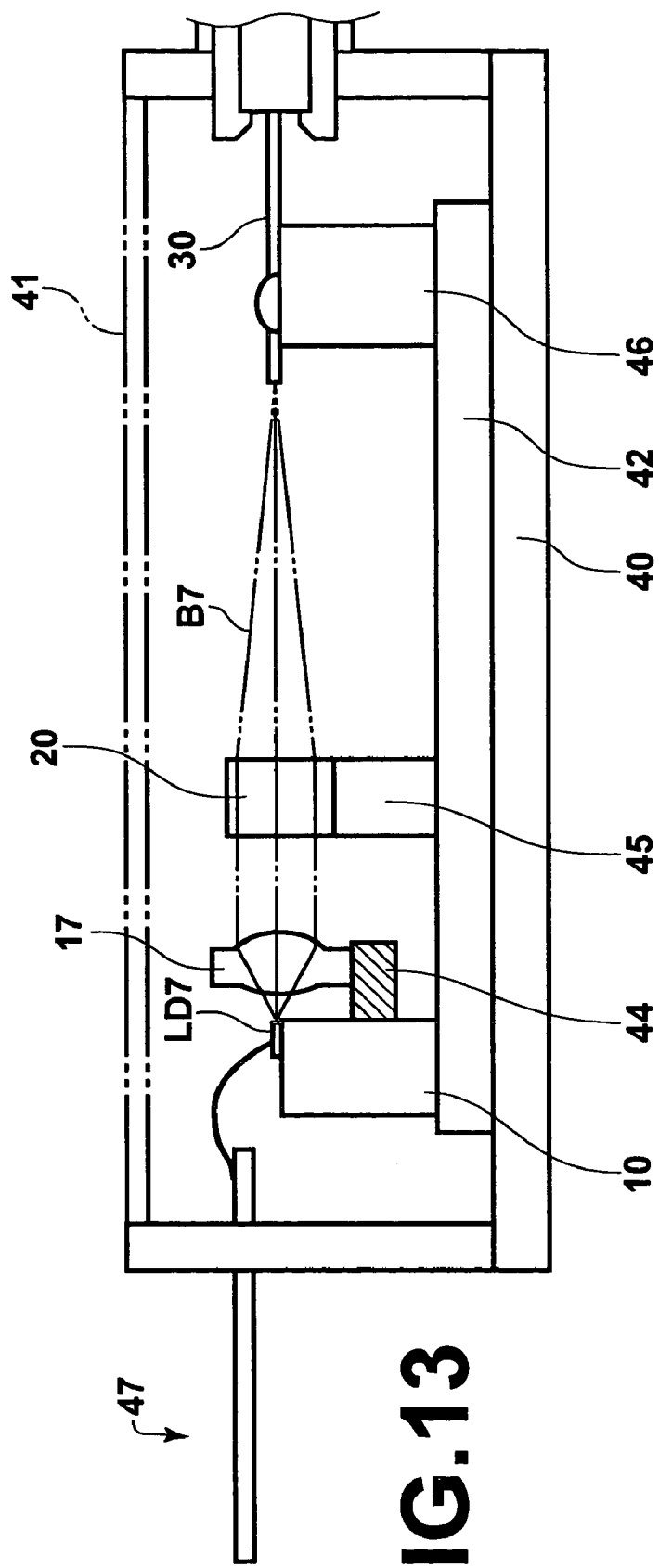
FIG. 13 is a side view showing the arrangement of the laser module shown in FIG. 12.

As shown in FIGS. 12 and 13, the wave combined laser is accommodated together with other optical elements in box-like package 40 open at the upper side. The package 40 is provided with a lid 41 which closes the opening of the package 40 and by closing the opening of the package 40 by the lid 41 after deaeration and introduction of sealing gas, the wave combined laser is air-tightly sealed in a closed space (sealed space).

A base plate 42 is fixed to the bottom surface of the package 40 and the heat block 10, a collective lens holder 45 which holds the collective lens 20 and a fiber holder 46 which holds the light inlet end portion of the multi-mode optical fiber 30 are mounted on the upper surface of the base plate 42. The light exit end portion of the multi-mode optical fiber 30 is drawn outside the package 40 through an opening formed in the wall of the package 40.

A collimator lens holder 44 is mounted on a side surface of the heat block 10 and the collimator lenses 11 to 17 are held there. An opening is formed in a side wall of the package 40 and wires for supplying a drive current to the GaN semi-conductor lasers LD1 to LD7 are drawn outside the package 40 through the opening.

In FIG. 13, only the GaN semi-conductor laser LD7 is numbered and only the collimator lens 17 is numbered in order to avoid complication of the drawing.

Figure 14:
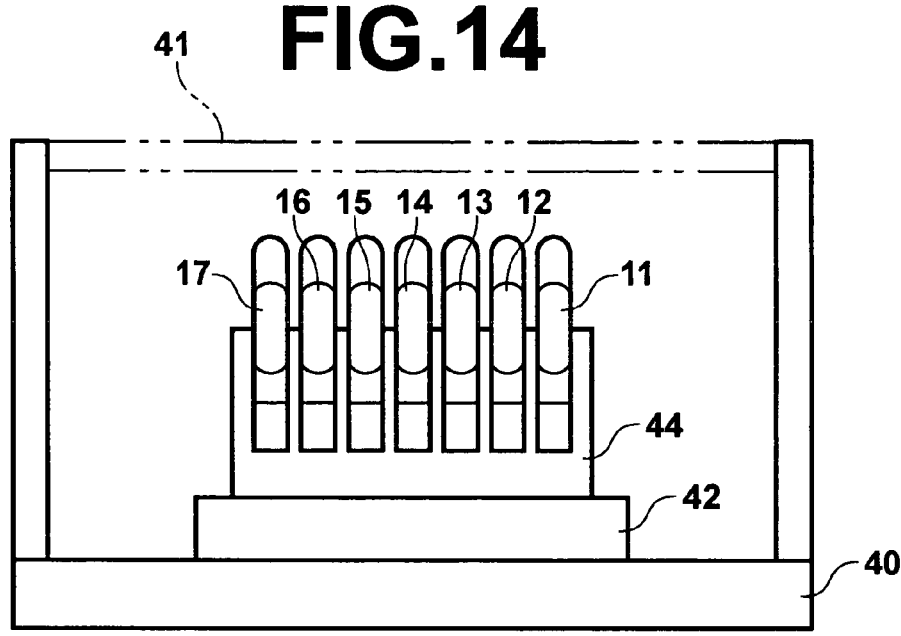
FIG. 14 is a fragmentary front elevation showing the arrangement of a part of the laser module shown in FIG. 12.

FIG. 14 is front view showing the mounting portion of the collimator lenses 11 to 17. As shown in FIG. 14, each of the collimator lenses 11 to 17 is of a shape obtained by slenderly cutting from a circular lens with an aspherical surface along parallel planes a portion including the optical axis. The slender collimator lens can be formed, for instance, by molding of resin or optical glass. The collimator lenses 11 to 17 are arranged close to the light emitting points of the GaN semi-conductor lasers LD1 to LD7 so that their longitudinal direction is perpendicular to the direction in which the light emitting points of the GaN semi-conductor lasers LD1 to LD7 are arranged (the direction from side to side in FIG. 14).

Each of the GaN semi-conductor lasers LD1 to LD7 is a laser provided with an active layer whose light emission width is 2 μm and the GaN semi-conductor lasers LD1 to LD7 respectively emit laser beams B1 to B7 with the divergent angles in directions parallel and perpendicular to the active layer being, for instance, 10° and 30°, respectively. The GaN semi-conductor lasers LD1 to LD7 are arranged so that their light emitting points are arranged in a row in a direction parallel to the active layer.

Accordingly, the laser beams B1 to B7 emitted from the light emitting points impinge upon the slender collimator lenses 11 to 17 with the direction of the larger divergent angles conforming to the longitudinal directions of the collimator lenses 11 to 17 and the direction of the smaller divergent angles conforming to the transverse directions (a direction perpendicular to the longitudinal direction) of the collimator lenses 11 to 17. Each of the collimator lenses 11 to 17 is 1.1 mm in width and 4.6 mm in length, and the beam diameter of each of the laser beams B1 to B7 impinging upon the collimator lenses 11 to 17 in the horizontal direction and that in the vertical direction are 0.9 mm and 2.6 mm, respectively. Further, each of the collimator lenses 11 to 17 is 3 mm in focal length ($f_1$=3 mm)and 0.6 in numerical aperture (NA=0.6), and the collimator lenses 11 to 17 are arranged at pitches of 1.25 mm.

The collective lens 20 is of a shape obtained by slenderly cutting from a circular lens with an aspherical surface along parallel planes a portion including the optical axis and is long in the direction of arrangement of the collimator lenses 11 to 17 (i.e., in the horizontal direction) and is short in a direction perpendicular to the direction of arrangement of the collimator lenses 11 to 17. The collective lens 20 is 23 mm in focal length ($f_2$=23 mm) and 0.2 in numerical aperture (NA=0.2). Also this collective lens 20 can be formed, for instance, by molding of resin or optical glass.

Figure 15:
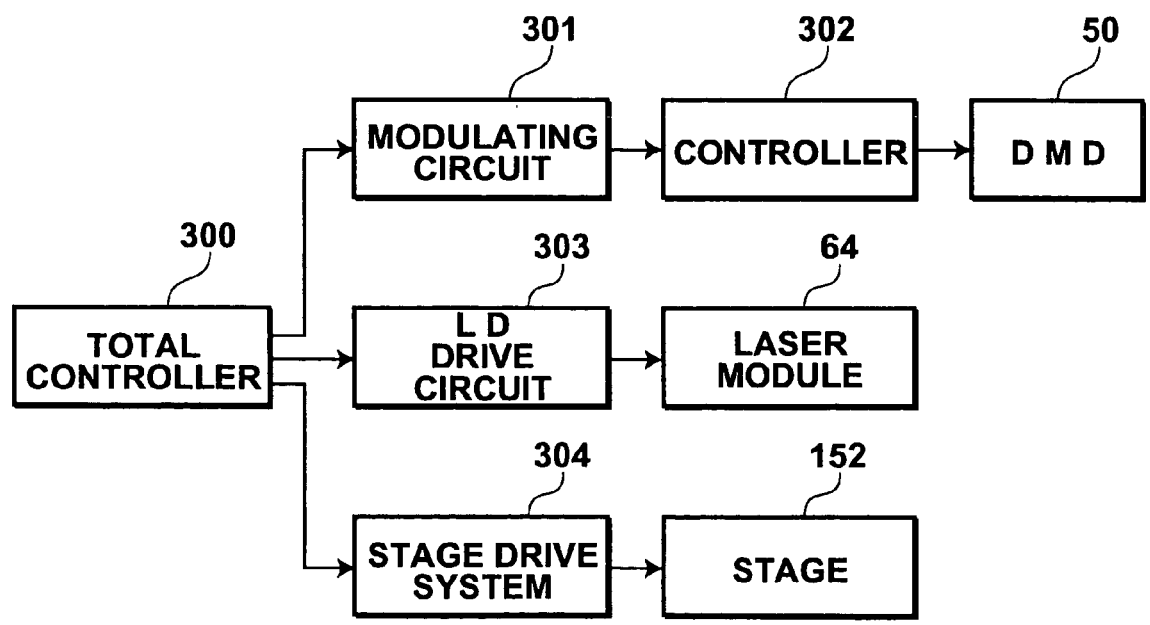
FIG. 15 is a block diagram showing the electrical arrangement of the exposure system.

The electrical arrangement of the exposure system of this embodiment will be described with reference to FIG. 15, hereinbelow. As shown in FIG. 15, a modulating circuit 301 is connected to a total controller 300, and a controller 302 which controls the DMD 50 is connected to the modulating circuit 301. Further, an LD drive circuit 303 which drives the laser module 64 is connected to the total controller 300, and a stage drive system 304 which drives the movable stage 152 is connected to the total controller 300.

[Operation of the Exposure System]

Operation of the exposure system described above will be described, hereinbelow. Each of the laser beams B1, B2, B3, B4, B5, B6 and B7 emitted in the state of divergent light from the corresponding one of the GaN semi-conductor lasers LD1 to LD7 (FIG. 11) which forms the wave combined laser of the fiber array light source 66 in each of the exposure heads 166 of the scanner 162 is converted to a parallel light beam by the corresponding one of the collimator lenses 11 to 17. The collimated laser beams B1 to B7 are collected by the collective lens 20 and converged on the light inlet end face of the core 30a of the multi-mode optical fiber 30.

In this embodiment, the collimator lenses 11 to 17 and the collective lens 20 form a collective optical system and the collective optical system and the multi-mode optical fiber 30 form a wave combined optical system. That is, the laser beams B1 to B7 collected by the collective lens 20 as described above enter the core 30a of the multi-mode optical fiber 30 and propagates through the optical fiber 30 to be combined into a single laser beam B. Then the single laser beam B is radiated from the optical fiber 31 coupled to the light exit face of the multi-mode optical fiber 30.

Assuming that the coupling efficiency of the laser beams B1 to B7 to the multi-mode optical fiber 30 is 0.9 and the output of each of the GaN semi-conductor lasers LD1 to LD7 is 50 mW, a wave combined laser beam B at an output of 315 mW (=50 mW×0.9×7) can be obtained for each of the optical fibers 31 arranged in an array. Accordingly, a laser beam B at an output of 4.4 W (=0.315 W×14) can be obtained for the 14 multi-mode optical fibers 31 in total.

Image data according to the exposure pattern is input into the controller 302 for the DMD 50 from the modulating circuit 301 (FIG. 15) and once stored in a frame memory thereof. The image data represents the density of each of the pixels forming the image, for instance, in three values (recording with a high density dot, recording with a low density dot and recording without dot).

The movable stage 152 attracting the glass substrate 150 against its surface is conveyed by the stage drive unit 304 at a constant speed along the guides 158 from the upstream side to the downstream side of the gate 160. When the movable stage 152 passes below the gate 160, the leading end of the glass substrate 150 is detected by the sensors 164 mounted on the gate 160, and when the leading end of the glass substrate 150 is detected by the sensors 164, the image data stored in the frame memory is read out lines by lines and the control signals are generated according to the image data read by the data processing portion for each of the exposure heads 166. Then the mirror drive portion turns on and off the micro mirrors of the DMD 50 of the corresponding exposure heads 166 on the basis of the generated control signals. In this particular embodiment, the size of the micro mirror forming one pixel is 14 μm×14 μm.

When the laser beam B is projected onto the DMD 50 from fiber array light source 66, the laser beam B reflected by the micro mirrors in the on state impinges upon the photoresist 150a through the lens systems 54 and 58. The laser beam emitted from the fiber array light source 66 is turned on and off pixel by pixel in this manner and the photoresist 150a is exposed to light. Further, since the glass substrate 150 is conveyed at a constant speed together with the movable stage 152, the photoresist 150a is sub-scanned by the scanner 162 in the direction opposite to the direction of movement of the movable stage 162 and a strip-like exposed area 170 is formed for each exposure head 166.

Figure 16A:
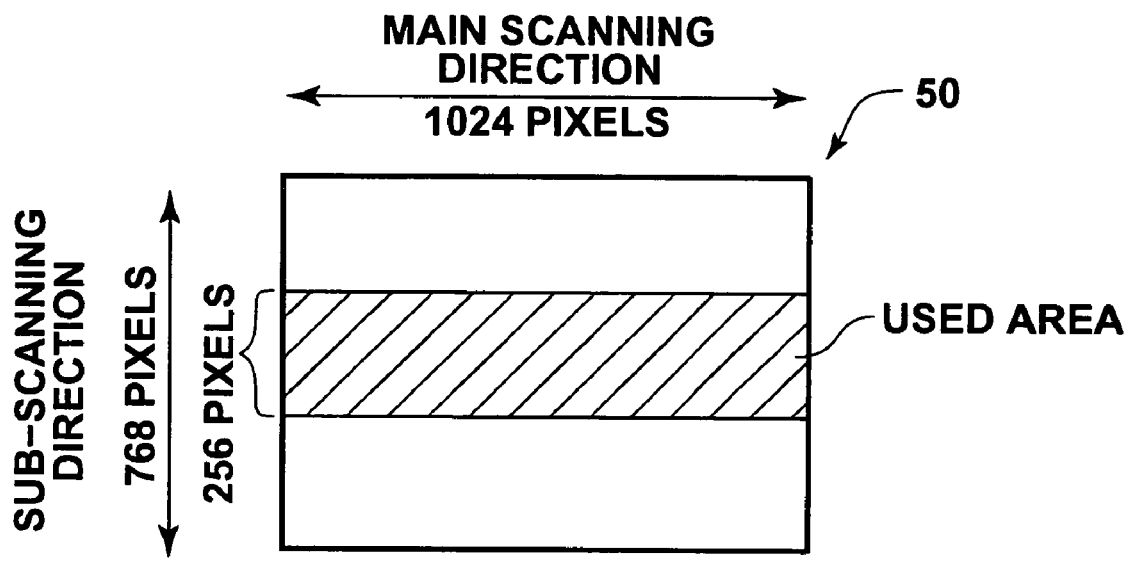
FIGS. 16A and 16B are views for illustrating examples of the used area of the DMD.
Figure 16B:
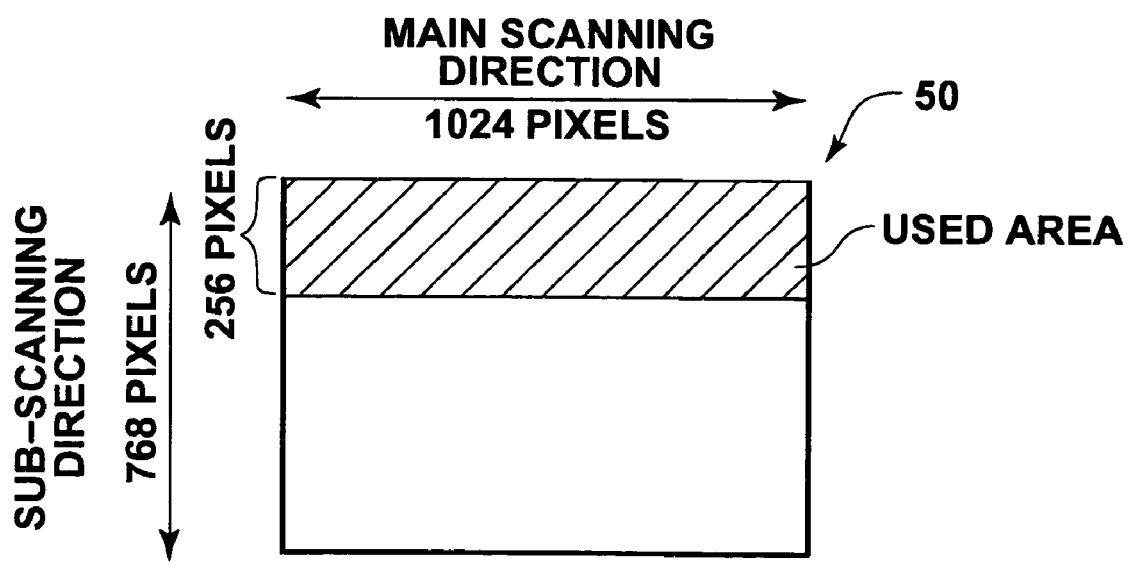

Though the DMD 50 in this particular example has 768 micro mirror rows (each comprising 1024 micro mirrors arranged in the main scanning direction) arranged in the sub-scanning direction as shown in FIGS. 16A and 16B, only a part of the micro mirror rows (e.g., 1024×256) are driven by the controller 302 in this particular example.

In this case, only the micro mirror rows disposed at a central portion of the DMD 50 as shown in FIG. 16A may be employed or only the micro mirror rows disposed in one edge portion of the DMD 50 as shown in FIG. 16B may be employed. Otherwise, the micro mirror rows employed may be selected on the basis of the situation. For example, when defect is found in a part of the micro mirrors, only the micro mirror rows free from the defect may be employed.

Since the data processing speed of the DMD 50 is limited and the modulating speed per one line is governed in proportion to the number of pixels employed, the modulating speed per one line can be increased by employing only a part of the micro mirror rows. On the other hand, when an exposure system where the exposure heads are continuously moved with respect to the exposed surface is employed, all the pixels arranged in the sub-scanning direction need not be used. In order to improve the resolution in the sub-scanning direction or to increase the sub-scanning speed, the exposure system is determined by determining the number of pixels (micro mirrors) to be used on the basis of the necessary modulating speed and setting the number of pixels in the sub-scanning direction to a necessary number.

When the sub-scanning of the photoresist 150a by the scanner 162 is completed and the trailing end of the glass substrate 150 is detected by the sensors 164, the stage 152 is returned along the guides 158 to its original position at the upstream position of the gate 160 by the stage drive unit 304 and then moved again at a constant speed along the guides 158 from the upstream side to the downstream side of the gate 160.

An illuminator optical system comprising the fiber array light source 66, the collective lens 71, the rod integrator 72, the imaging lens 74, the mirror 69 and the TIR prism 70 shown in FIG. 5 for projecting the laser beam B onto the DMD 50 as illuminative light will be described, hereinbelow. The rod integrator 72 is a light-transmitting rod shaped, for instance, into a rectangular column and as the laser beam B propagates through the rod integrator 72 repeating total internal reflection, the intensity distribution in a beam cross-section of the laser beam B is uniformed. An antireflection coating is provided on the light inlet end face and the light exit end face of the rod integrator 72 to increase the transmissivity of the light inlet end face and the light exit end face of the rod integrator 72. When the intensity distribution in a beam cross-section of the laser beam B is highly uniformed in this manner, the illuminative light can be uniformed and the photoresist 150*a* can be exposed to a high-definition image.

The intermediate tone exposure of the photoresist 150*a* will be described with reference to FIG. 8, hereinbelow. As described above, in this embodiment, since the DMD 50 is inclined, exposure beam spots adjacent to each other in the sub-scanning direction are slightly (e.g. by about 0.1 to 0.5 μm) shifted to each other in the main scanning direction. Since the diameter of the exposure spots is about 5 to 20 μm and is larger than the space between exposure spots, the photoresist 150*a* is exposed multiple times (multiple exposure) with two or more of pixels of the DMD 50 partly overlapping. That is, referring to FIG. 8B, when the part of the photoresist 150*a* exposed to an exposure beam spot 53*a* indicated by hatching in FIG. 8B is brought to a position, where it is exposed to another exposure beam spot 53*b*, 53*c* or 53*d*, in response to the sub-scanning, the multiple exposure is carried out by controlling the action of the micro mirrors 62 of the DMD 50 so that the another exposure beam spot is actually projected onto the photoresist 150*a*. FIG. 8C shows overlap of the exposure beam spots 53 when the multiple exposure is thus carried out. As can be seen from FIG. 8C, a plurality of exposure beam spots 53 are arranged slightly shifted to each other in the main scanning direction.

In this particular embodiment, for instance, a state where 10 times multiple exposure is carried out by turning on ten micro mirrors 62 arranged in one row, a state where 5 times multiple exposure is carried out by turning on five of the ten micro mirrors 62 and a state where no exposure is carried out by turning off all the ten micro mirrors 62 are switched. The switching is done by the controller 302 shown in FIG. 15 on the basis the three-valued image data input thereinto. That is, when the three values respectively show recording with a high density dot, recording with a low density dot and recording without dot, it is determined corresponding thereto which one of the "10 times multiple exposure", the "5 times multiple exposure" and the "no exposure" is to be carried out.

By the operation described above, in this embodiment, exposed areas different from each other in the amount of the light to which the area is exposed in two stages can be formed in the photoresist 150*a* by one exposure. Accordingly photoresist which is controlled in its thickness in two stages according to the exposure pattern can be formed through subsequent development of the photoresist 150*a*.

As described above, in accordance with this method, the intermediate tone exposure is carried out by controlling the action of the DMD 50. Accordingly, a high definition mask conventionally used is not necessary and the exposure mask itself sometimes becomes unnecessary. Accordingly, in accordance with this method, an intermediate tone exposure of the photoresist 150*a* can be realized at low cost.

Though, in the embodiment described above, the amount of the light to which the photoresist 150*a* is exposed is controlled in two stages, it is of course possible to control the amount of the light to which the photoresist 150*a* is exposed in three or more stages by setting the number of times of the multiple exposure to three or more in a manner similar to that described above.

Further, though, in the embodiment described above, the amount of the light to which the photoresist 150*a* is exposed is changed by changing the number of times of the multiple exposure in response to the sub-scanning, the intermediate tone exposure can be realized also in the system where the photoresist is surface-exposed by the use of a two-dimensional spatial light modulator element without effecting the sub-scanning by stepwise changing the exposure pixel by pixel of the two-dimensional spatial light modulator element.

Another embodiment of the present invention in which the exposure is controlled by another technique will be described with reference to FIG. 17, hereinbelow. In FIG. 17, the elements analogous to those described above are given the same reference numerals and will not be described unless necessary (the same in the following figures).

Though, in the embodiments described above, the number of overlapping spots 53 of the laser beam B (exposure beam spots) emanating from the micro mirrors 62 which are arranged on a row extending substantially in the sub-scanning direction are changed according to the desired exposure, spots 53 of the laser beam B emanating one from each of five micro lens rows each extending substantially in the sub-scanning direction are caused to overlap in one position in this embodiment. That is, in this embodiment, a plurality of, five at most, exposure beam spots 53 can be caused to overlap in substantially the same position on the photoresist 150*a* as can be understood from the state of inclination of the DMD 50 to the sub-scanning direction shown in FIG. 17A and the state of overlap of the exposure beam spots 53 shown in FIG. 17B, and the exposure of position on the photoresist 150*a* can be controlled by controlling the number of spots 53 to be caused to overlap in the position.

Still another embodiment of the present invention in which the exposure is controlled by still another technique will be described with reference to FIG. 18, hereinbelow. In this embodiment, spots 53 of the laser beam B emanating one from each of two micro lens rows each extending substantially in the sub-scanning direction are concentrated in an area 53P and the exposure is changed by areas as can be understood from the state of inclination of the DMD 50 to the sub-scanning direction shown in FIG. 18A and the state of overlap of the exposure beam spots 53 shown in FIG. 18B.

In this embodiment, the laser beams B emanating from the two micro mirror rows, five at most from one micro mirror row (total ten), are concentrated in the area 53P and accordingly, the exposure can be changed in 11 stages when the case where the exposure is 0 is included. FIG. 18C show the area 53P in three states different in the number of overlapping exposure beam spots 53 ((1), (2) and (3)) by way of example. The exposure beam spots 53 are arranged in the main scanning direction (the direction from side to side in FIG. 18A) at pitches of, for instance, 0.25 μm and the length of each side of the area 53P is, for instance, about 2.5 μm.

When the number of overlapping exposure beam spots 53 is thus changed, the number of overlapping exposure beam spots 53 can also be controlled, for instance, by the controller 302 shown in FIG. 15 on the basis of image data input thereinto.

Still another embodiment of the present invention in which the exposure is controlled by still another technique will be described with reference to FIGS. 19 and 20, hereinbelow. In this embodiment, the DMD 50 are divided into three blocks, a first block 50A, a second block 50B and a third block 50C as shown in FIG. 19A, and which of the blocks is to be used in exposure is determined according to the image data. Further, as can be understood from the state of inclination of the DMD 50 to the sub-scanning direction shown in FIG. 19A and the position of the exposure beam spots 53 shown in FIG. 19B, the exposure beam spot 53 can be projected onto a desired main scanning position irrespective of which of the blocks, the first block 50A, the second block 50B and the third block 50C, is to be used since the micro mirror row to be used is shifted by one each according to which of the blocks, the first block 50A, the second block 50B and the third block 50C, is to be used to expose a given main scanning position.

Further, as shown in FIG. 20, the time for which the micro mirrors 62 of the DMD 50 are kept on differs by the blocks, the first block 50A, the second block 50B and the third block 50C. In this particular embodiment, assuming that the time for which the micro mirrors 62 of the first block 50A are kept on is 100%, the time for which the micro mirrors 62 of the second block 50B are kept on is set to be 66% and the time for which the micro mirrors 62 of the third block 50C are kept on is set to be 33%.

Accordingly, the shape of the exposure beam spot 53 on the photoresist 150a slightly differs according to which of the blocks, the first block 50A, the second block 50B and the third block 50C, is to be used in exposure (the shape is determined by the relation between the sub-scanning speed and the time for which the micro mirrors 62 are kept on) and the ratio of the exposure between the cases is about 3:2:1. With this arrangement, the exposure can be changed in four stages in this embodiment when the case where the exposure is 0 is included.

It is possible to change the exposure by the use in combination of the technique described above where the time for which the micro mirrors 62 of the DMD 50 are kept on is controlled and the technique described previously where the number of pixels of the overlapping portions is controlled. By this, the number of stages in which the exposure can be set can be increased.

Further, the exposure can be changed also by the use of a spatial light modulator element where the power of the exposure beam spot is variable (e.g., a spatial light modulator element on the basis of diffraction). Further, by the use of the technique in combination with the technique where the time for which the micro mirrors 62 of the DMD 50 are kept on is controlled and the technique where the number of pixels of the overlapping portions is controlled, the number of stages in which the exposure can be set can be further increased.

Figure 21A:
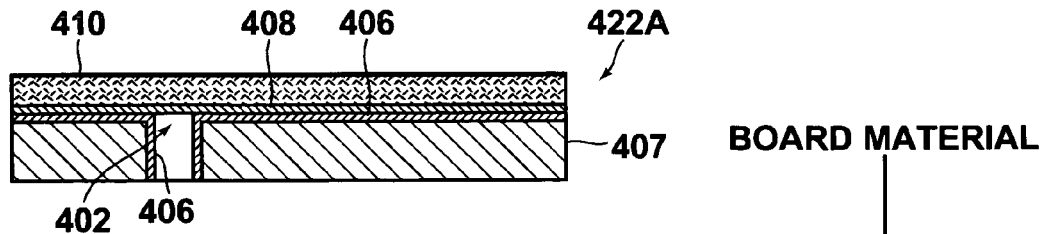
Figure 21B:
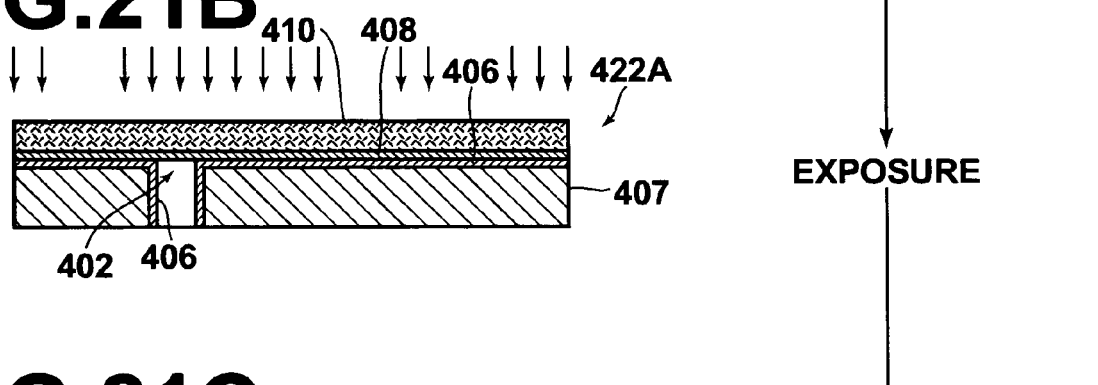
Figure 21C:
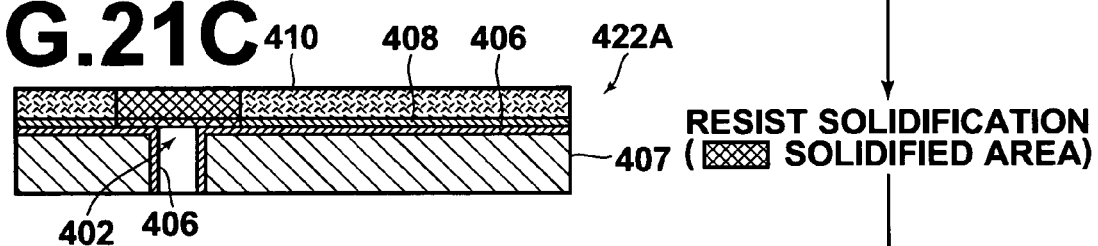
Figure 21D:
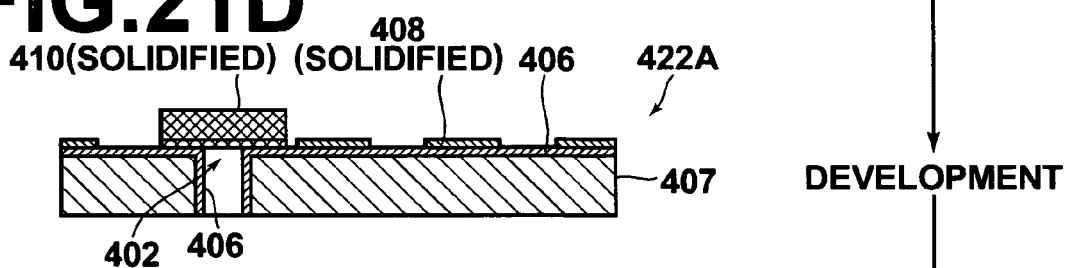

Still another exposure method in accordance with still another embodiment of the present invention will be described with reference to FIGS. 21 and 22, hereinbelow. The exposure method of this embodiment is for finally producing a printed circuit board 422P, and the photoresist coated on the board 422P is exposed to light to form a desired printed circuit pattern. FIG. 21 show the steps of forming the printed circuit pattern including the exposure method in sequence, and FIG. 22 shows an arrangement of the system for carrying out the method.

Figure 21E:
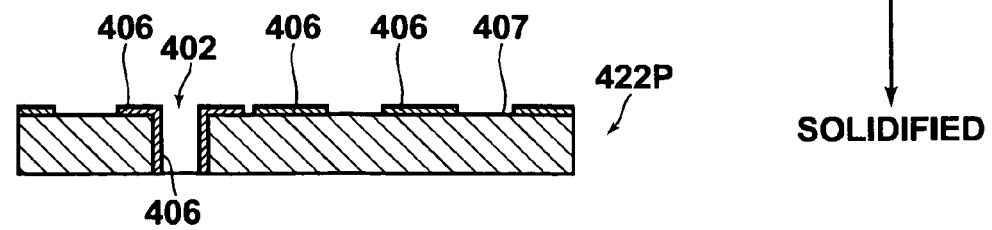
Figure 22:
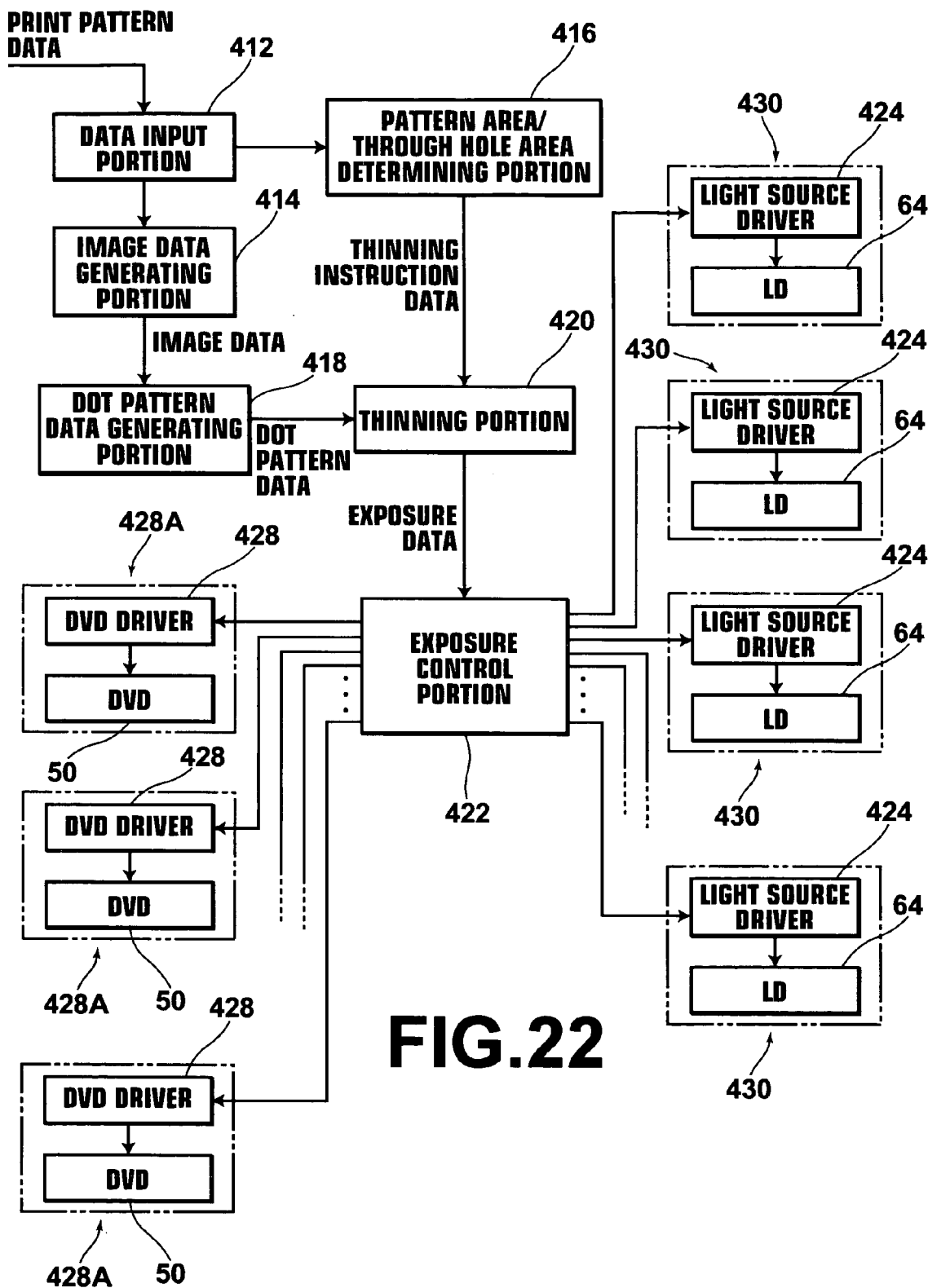
FIG. 22 is block diagram of the system for carrying out the method of FIG. 21, FIGS. 23A to 23C are views for illustrating states of the exposure by the thinning exposure.

The printed circuit board 422 in the finished state is provided with a printed circuit pattern formed of copper film 406 and through holes 402 of a diameter of about 3 mm in suitable positions as shown in FIG. 21E. Each of the through holes 402 is provided with copper film along its periphery and on its inner surface and is for electrically and mechanically connecting an electronic component or for electrically connecting the printed circuit patterns provided on opposite sides of the printed circuit board 422P.

The printed circuit board 422P is formed from a board material 422A shown in. The board material 422A comprises a base 407 on the surface (or on each surface) of which a layer of copper film 406 is formed by deposition or the like, and negative second photoresist layer 408 of relatively high photosensitivity and negative first photoresist layer 410 of relatively low photosensitivity coated on the layer of copper film 406 in this order. In FIG. 21A, the protective layer and the like are abbreviated.

The board material 422A is loaded in the image exposure system and negative first and second photoresist layers 410 and 408 are exposed to light according to the print pattern data as shown in FIG. 21B. At this time, the exposure differs between the area of the circuit pattern image and the area of the through hole image. More specifically, the exposure is small in the former and the exposure is large in the latter. Such control of the exposure will be described later.

As shown in FIG. 21C, with such exposure, only the high sensitive second photoresist layer 408 is solidified in the area of the circuit pattern image where the exposure is small whereas the low sensitive first photoresist layer 410 is solidified together with the high sensitive second photoresist layer 408 in the area of the through hole image where the exposure is large.

When the development is subsequently carried out, the solidified parts of the first and second photoresist layers 410 and 408 are left and the other parts of the first and second photoresist layers 410 and 408 are removed as shown in FIG. 21D.

When the etching is subsequently carried out, the exposed copper film 406 and the solidified parts of the first and second photoresist layers 410 and 408 are eluted and a finished printed circuit board 422P shown in FIG. 21E is obtained. In the area of the through hole image, by keeping closed the through hole 402 by thick photoresist by solidifying the low sensitive first photoresist layer 410 together with the second photoresist layer 408, the etching solution is prevented from leaking to the back side of the board through the through hole 402 before etching of the copper film 406 is completed.

The arrangement for controlling the exposure in the manner described above will be described with reference to FIG. 22, hereinbelow. In this example, the print pattern data is input into a data input portion 412 and then transferred to an image data generating portion 414 and a pattern area/through hole area determining portion 416. The image data generating portion 414 generates image data taking the surface of the printed circuit board 422P as an image area on the basis of the input print pattern data, and transfers it to a dot pattern data generating portion 418. The dot pattern data generating portion 418 transforms the image data to dot pattern data and transfers the dot pattern data to a thinning portion 420.

The pattern area/through hole area determining portion 416 distinguishes the pattern area and the through hole area from each other on the basis of the input print pattern data and transfers to the thinning portion 420 thinning instruction data for thinning down the dot pattern forming the image of the pattern area.

To the thinning portion 420, the dot pattern data generated by the dot pattern data generating portion 418 has been input and the image of the pattern area is thinned on the basis of the thinning instruction data. As described above with reference to FIGS. 17 and 18, the thinning is processing for changing the exposure. That is, for instance, in the example shown in FIG. 18, at most twelve exposure beam spots 53 can be projected onto one area which is to be exposed in the multiple exposure. The thinning portion 420 determines the number of the exposure beam spots to be thinned from the twelve exposure beam spots. Naturally, as the number of the exposure beam spots to be thinned from the twelve exposure beam spots increases, the exposure is lowered.

By this thinning, the ratio of the exposure of the pattern area EP to that of the through hole area ES is 1/8 (0.125) (EP/ES=1/8). It is preferred that EP/ES be 0.01 to 0.5. When EP/ES is smaller than 0.01, an exposure ratio larger than a hundred times must be realized, which is not practical. Whereas, when EP/ES is larger than 0.5, the exposure ratio becomes not smaller than twice and it becomes impossible to form areas which clearly differ in thickness of the photoresist.

The dot pattern data which has undergone the thinning is transferred to an exposure control portion 422. The exposure control portion 422 transfers a lighting signal to a light source driver 424 for a light source unit 430 at a processing initiating timing (e.g., a timing at which movement of the movable stage 152 shown in FIG. 1 is to be initiated), and the light source driver 424 drives the laser module 64 on the basis of the lighting signal.

Whereas the exposure control portion 422 controls DMD drivers 428 of a plurality of head assemblies 428A to transfer an on/off signal to the DMD 50 at the exposure initiating timing on the basis of the dot pattern data. The DMD 50 is driven on the basis of the on/off signal.

The thinning portion 420 does not thin the dot pattern which form an edge portion of the pattern image when it thins the dot pattern data of the pattern area to 1/8. The effect of this will be described, hereinbelow.

Figure 23A:
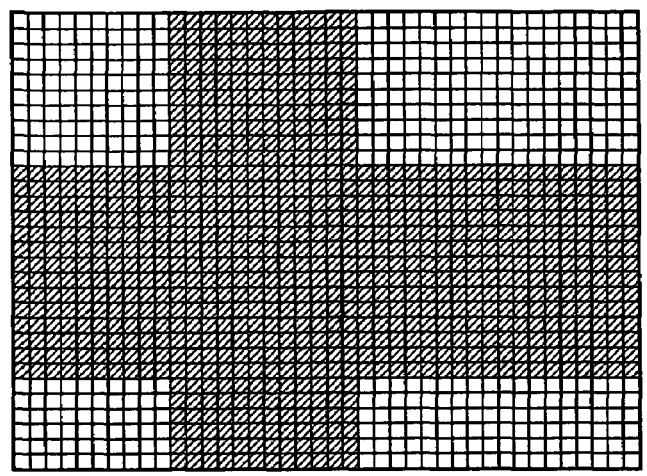
Figure 23B:
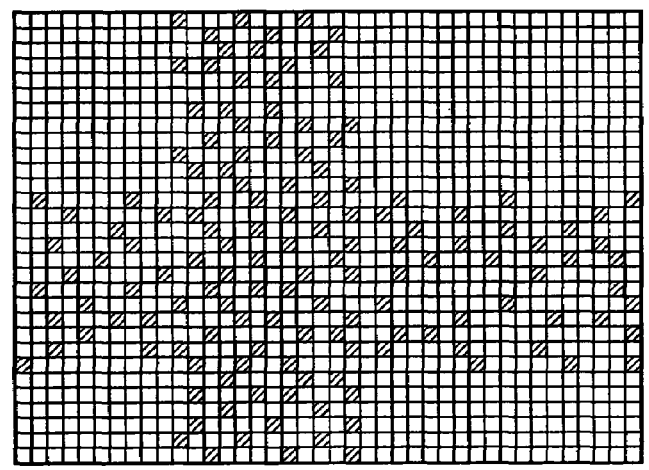

For example, assuming that an image of a cross shown in FIG. 23A is generated by the dot pattern data generating portion 418 shown in FIG. 22 as the image of the pattern area, the dot patterns which instruct on-state on average are scattered as shown in FIG. 23B when the dot pattern instructing on-state of the micro mirrors 62 continuous in the x-direction is thinned at random. Though the dot patterns are actually arranged so that adjacent dot patterns overlap each other to expose the same area and one pixel is expressed by a plurality of dot patterns, a single dot pattern is expressed by a single square in FIG. 23. In this particular embodiment, the dot pattern is about 0.3 μm in dimensions, and the resolution is such that a line of a width of about 20 μm at least can be depicted.

Even by the thinning shown in FIG. 23B, the exposure of the pattern area can be reduced and the exposure ratio EP/ES can be made within the above range. However, by the thinning shown in FIG. 23B, the edges in the pattern area is not microscopically straight due to the fact that the dot patterns corresponding to the edges in the pattern area are sometimes in the on-state and sometimes in the off-state.

Figure 23C:
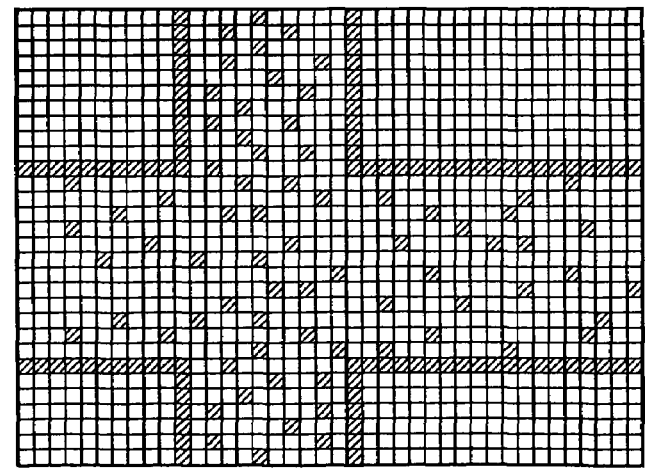

The thinning portion 420 shown in FIG. 22 does not thin the dot pattern which form an edge portion of the pattern image, and performs the thinning with the other dot patterns, whereby the image shown in FIG. 23C is depicted as a result.

Figure 24:
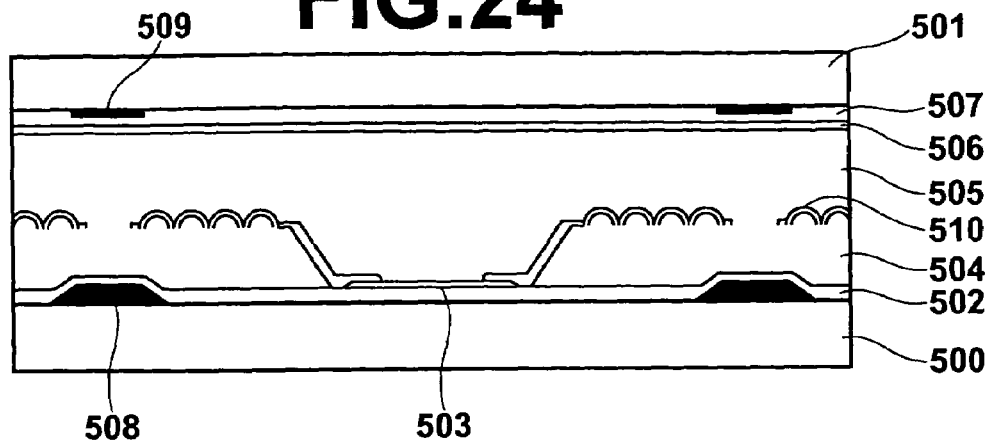
FIG. 24 is a schematic side cross-sectional view of an LCD-TFT panel to which the exposure method of the present invention is applied.

Still another exposure method in accordance with still another embodiment of the present invention will be described with reference to FIG. 24, hereinbelow. In the method of this embodiment, the material of a kind of structural member is left on the substrate material in a state where the thickness differs in two stages. More specifically, a high transmission type LCD-TFT panel which is disclosed also in "Sharp Technical Report", No 85, April 2003, pp. 34-35, described above, is shown in FIG. 24, and the high transmission type LCD-TFT panel comprises a pair of glass substrates 500 and 501 between which an insulating film 502, a transparent electrode 503 forming a light-transmitting portion, an acrylic resin layer 504 for forming a reflecting portion as the structural member, a liquid crystal layer 505, an ITO electrode 506 and a color filter 507 are formed. A reference numeral 508 denotes a source bus line and a reference numeral 509 denotes a black matrix. An aluminum electrode 510 which functions as reflecting film which reflects light from above as seen in FIG. 24 is formed on the surface of the acrylic resin layer 504 for forming the reflecting portion. In this structure, the area surrounded by the black matrix 509 forms one pixel and the light-transmitting portion and the reflecting portion exist in one pixel.

Figure 25A:
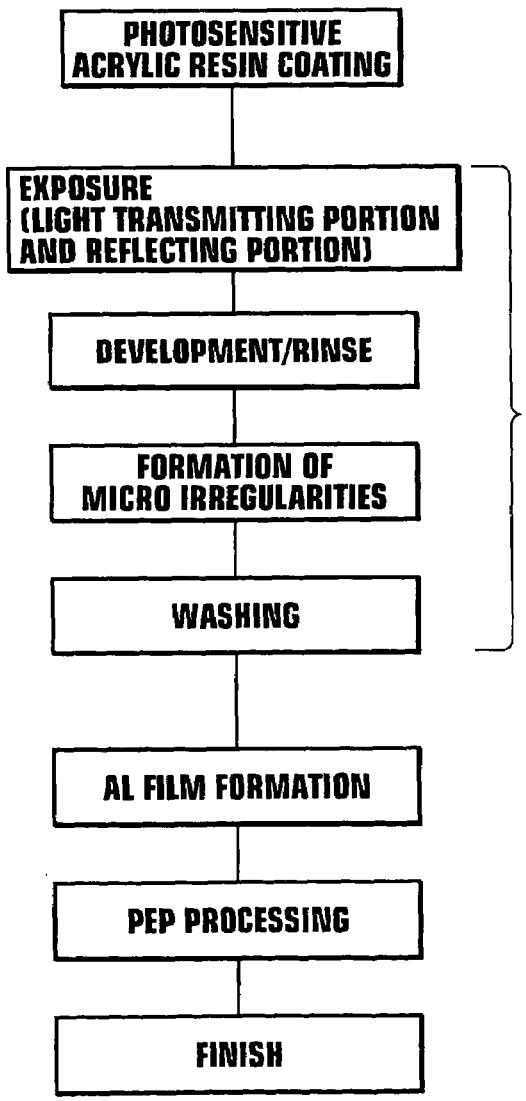
FIGS. 25A and 25B are views showing the steps of the exposure method of the present invention in comparison with those of the conventional exposure method.

Further, on the surface of the acrylic resin layer 504 on which the aluminum electrode 510 is formed, micro irregularities are formed in order to increase the light-scattering function, thereof. When forming such structure, the steps shown in FIG. 25A are conventionally employed. That is, photosensitive acrylic resin forming the acrylic resin layer 504 is first coated, and then exposure for forming the light-transmitting portion and the reflecting portion is effected, That is, when the photosensitive acrylic resin is of a positive type, the exposure to light is effected by the use of a predetermined photo-mask so that the part to make the light-transmitting portion is exposed to light and the part to make the reflecting portion is not exposed to light.

After subsequent development/rinsing, the part of the photosensitive acrylic resin which has not been exposed to light is left whereas the part of the photosensitive acrylic resin which has been exposed to light is eluted. Then the surface of the left acrylic resin layer 504 is processed to form micro irregularities, and then washed. Thereafter, aluminum film for forming the aluminum electrode 510 is formed, and then PEP (photolithography) step is applied thereto to make the aluminum film into a predetermined shape, whereby the above structure is finished.

Figure 25B:
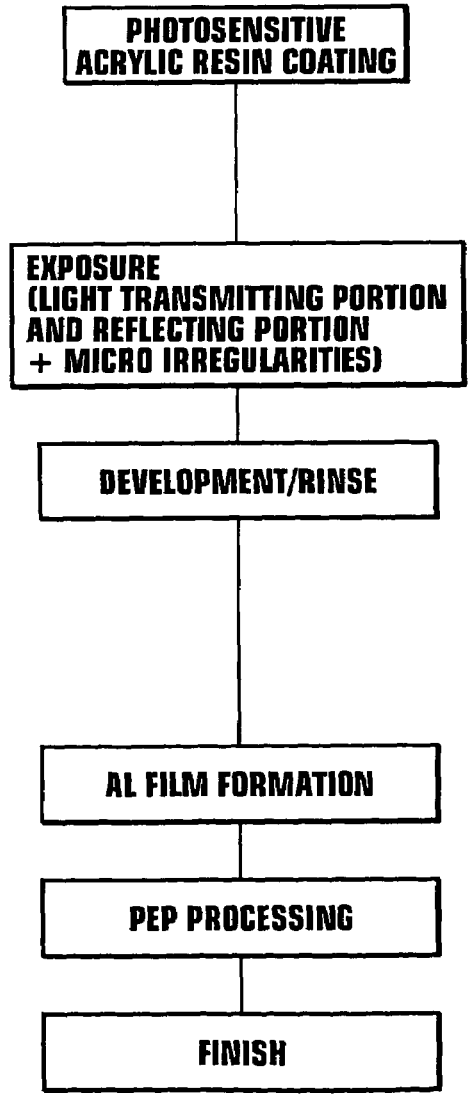

Whereas when the exposure method of the present invention is applied, the above structure can be formed by the steps shown in FIG. 25B. That is, in this case, the exposure is increased when the part to make the light-transmitting portion is exposed to light and the exposure is decreased according to a predetermined pattern when the part to make the reflecting portion is exposed to light. With this, the acrylic resin of the part where the exposure has been increased is completely diluted and the light-transmitting portion is formed after subsequent development/rinsing. Whereas, the acrylic resin of the part where the exposure has been decreased is diluted to some depth and a predetermined pattern of recessed portion is formed, whereby irregularities are formed on the surface of the acrylic resin layer 504 left as the reflecting portion.

That is, by application of the exposure method of the present invention, the processing of forming the irregularities, and the processing of washing which have been involved in the conventional method shown in FIG. 25A can be abbreviated.

Though, in the embodiment described above, by exposing the acrylic resin layer 504 to light so that the exposure differs in two stages, the acrylic resin layer 504 is left in a state where the thickness differs in two stages, it is of course possible to left the acrylic resin layer 504 in a state where the thickness differs in three or more stages by exposing the acrylic resin layer 504 to light so that the exposure differs in three or more stages.

Still another exposure method in accordance with still another embodiment of the present invention will be described, hereinbelow. In the method of this embodiment, a plurality of kinds of structural members are formed on the substrate material. More specifically, ribs and the columns are formed on a LCD-CF panel (substrate material) as structural members.

Referring to FIG. 26, a spacer (the column) 622 and a liquid crystal orientation control projection (the rib) 624 formed in a liquid crystal layer 618 are described first. These members are simultaneously formed by formation of a first negative type photosensitive transparent resin layer (a first transparent layer) which is relatively higher in photosensitivity and a second negative type photosensitive transparent resin layer (a second transparent layer) which is relatively lower in photosensitivity in this order from a conductive layer on color filter film 614 by laminating a transfer sheet with the conductive film (not shown) on the color filter film 614 formed on a light-transmitting substrate 610B, projection of laser thereonto from the light-transmitting substrate side with low energy level to the area which makes the liquid crystal orientation control projection 624 and with high energy level to the area which makes the spacer 622, and subsequent development.

That is, the liquid crystal orientation control projection 624 is formed in the form of a protrusion where only the first transparent layer is left and the spacer 622 is formed in the form of a column where both the first and second transparent layers are left. As can be seen, the spacer 622 where both the first and second transparent layers are left is thicker by the thickness of the second transparent layer than the liquid crystal orientation control projection 624 where only the first transparent layer is left. By suitably selecting the thicknesses of the negative type photosensitive transparent resin layers, each of the liquid crystal orientation control projection 624 and the spacer 622 can have an optimal thickness or height.

Specific steps will be described, hereinbelow.

[Production of the Transfer Sheet]

The surface of a temporary base of polyethylene terephthalate (PFT temporary base) film 75 μm thick was primed with a gelatin layer 0.2 μm thick and a coating solution having the following recipe H1 was coated on the surface of the gelatin layer and dried to form a thermoplastic resin layer 20 μm thick in dry thickness. Further, a coating solution having the following recipe B1 was coated on the thermoplastic resin layer and dried to form an interlayer 1.6 μm thick in dry thickness. The "part" in the following recipe is on the basis of mass.

[Recipe H1 of the Thermoplastic Resin Layer]
methyl methacrylate/2-ethylhexyl acrylate/benzyl methacrylate/methacrylic acid copolymer . . . 15 parts
(ratio of copolymerization [mole ratio]=55/4.5/11.7/28.8, weight-average molecular weight 90000)
polypropylene glycol diacrylate (average molecular weight=822) . . . 6.5 parts
tetraethylene glycol dimethacrylate . . . 1.5 parts
tolenesulfonamide . . . 0.5 parts
benzophenone . . . 1 part
methyl ethyl ketone . . . 30 parts

[Recipe B1 of the interlayer]
poly(vinyl alcohol) . . . 130 parts
(PVA-205 (saponification factor=80%, Kuraray Co. Ltd.)
poly(vinylpyrrolidone) . . . 60 parts
(K-90, GAF Corporation)
fluorine surface active agent . . . 10 parts
(Surflon S-131, Asahi Glass Co. Ltd)
distilled water . . . 3350 parts A negative type photosensitive transparent resin solution for a transparent layer (A1 layer) having the recipe shown in the following table 1 was further coated on the interlayer of the temporary base on which the thermoplastic resin layer and the interlayer were thus provided, and dried to form a negative type photosensitive transparent resin layer A1 1.2 μm thick. Subsequently, polypropylene cover film (12 μm in thickness) was contact-bonded on the negative type photosensitive transparent resin layer A1, whereby a photosensitive transfer sheet SA1 where the thermoplastic resin layer, the interlayer and the negative type photosensitive transparent resin layer A1 were laminated was produced.

TABLE 1

|  | A1 |
|---|---|
| benzyl methacrylate/methacrylic acid copolymer [mole ratio] = 73/27, molecular weight 30000) | 7.8 |
| dipentaerythritol hexaacrylate | 5.2 |
| fluorine surface active agent | 0.06 |
| (MegaFac F-176, Dainippon Ink and Chemicals Incorporated) | |
| 2-trichloro(methyl)-5-(p-styrylstyryl)-1,3,4-oxadiazole | 0.32 |
| phenothiazine | 0.012 |
| polypropylene glycol monomethyl ether acetate | 27 |
| methyl ethyl ketone | 35 |

Another polyethylene terephthalate film temporary base 75 μm thick was prepared. A coating solution having the above recipe H1 was coated on the surface of the TFT and dried to form a thermoplastic resin layer 20 μm thick in dry thickness. Further, a coating solution having the above recipe B1 was coated on the thermoplastic resin layer and dried to form an interlayer 1.6 μm thick in dry thickness. A negative type photosensitive transparent resin solution for a transparent layer (P1 layer) having the recipe shown in the following table 2 was further coated on the interlayer of the temporary base on which the thermoplastic resin layer and the interlayer were thus provided, and dried to form a negative type photosensitive transparent resin layer P1 4.0 μm thick. Subsequently, polypropylene cover film (12 μm in thickness) was contact-bonded on the negative type photosensitive transparent resin layer P1, whereby a photosensitive transfer sheet SP1 where the thermoplastic resin layer, the interlayer and the negative type photosensitive transparent resin layer P1 were laminated was produced.

TABLE 2

|  | P1 |
|---|---|
| benzyl methacrylate/methacrylic acid copolymer [mole ratio] = 73/27, molecular weight 30000) | 7.8 |
| dipentaerythritol hexaacrylate | 5.2 |
| fluorine surface active agent | 0.06 |
| (MegaFac F-176, Dainippon Ink and Chemicals Incorporated) | |
| Irgacure 651 (Ciba-Geigy Ltd.) | 0.32 |
| phenothiazine | 0.012 |
| polypropylene glycol monomethyl ether acetate | 27 |
| methyl ethyl ketone | 35 |

The photosensitivity $h^1$ of the negative type photosensitive transparent resin layer A1 of the photosensitive transfer sheet SA1 and the photosensitivity $h^2$ of the negative type photosensitive transparent resin layer P1 of the photosensitive transfer sheet SP1 were adjusted so that the ratio therebetween $h^1/h^2$ was 10.

[Production of the Spacer and the Liquid Crystal Orientation Control Projection]

By the use of these photosensitive transfer sheets SA1 and SP1, the spacer and the liquid crystal orientation control projection were formed, in the following method by the exposure system similar to that described above, on a color filter which had been formed on a glass substrate (0.7 mm thick).

An ITO film was first formed by sputtering on the color filter which had been formed in advance so that the resistance is 20Ω/. The cover film of the photosensitive transfer sheet SA1 was peeled off and the surface of the exposed negative type photosensitive transparent resin layer A1 thereof is pressed (0.8 kg/cm 2) against the ITO film and heated (130° C.) by the use of a laminator (VP-II, Taisei Laminator Co. Ltd.), thereby laminating the negative type photosensitive transparent resin layer A1 and the ITO film. Thereafter, the photosensitive transfer sheet SA1 was peeled along the interface between the interlayer and the negative type photosensitive transparent resin layer A1, whereby only the transparent negative type photosensitive transparent resin layer A1 was transferred to the glass substrate.

Thereafter, the cover film of the photosensitive transfer sheet SP1 was peeled off and the surface of the exposed negative type photosensitive transparent resin layer P1 thereof was laminated to the negative type photosensitive transparent resin layer A1 in the same manner as described above. Thereafter, the photosensitive transfer sheet SA1 was peeled along the interface between the temporary base and the thermoplastic resin layer, and transfer was carried out so that the negative type photosensitive transparent resin layer A1/the negative type photosensitive transparent resin layer P1/the interlayer/the thermoplastic resin layer were transferred to the glass substrate in this order.

Thereafter, by the exposure system arranged as described above, exposure was carried out with a laser beam of 405 nm at 4 mJ/cm$^2$ and at 40 mJ/cm$^2$. At this time, the part where only the negative type photosensitive transparent resin layer A1 was to be left to form the liquid crystal orientation control projection 624 (or to form the first transparent layer) was exposed at 4 mJ/cm$^2$, and the part where both the negative type photosensitive transparent resin layer A1 and the negative type photosensitive transparent resin layer P1 were to be left to form the spacer 622 (or to form the second transparent layer) was exposed at 40 mJ/cm$^2$. The exposure can be changed in this manner, for instance, by applying the exposure control (e.g., the thinning).

Then the negative type photosensitive transparent resin layer P1 was developed with developer PD2 (Fuji Photo Film Co., Ltd.) and the thermoplastic resin layer and the interlayer were removed. At this time, the negative type photosensitive transparent resin layer A1 was not substantially developed. Thereafter, the negative type photosensitive transparent resin layer A1 was developed with developer CD1 (Fuji Photo Film Co., Ltd.) to remove the unnecessary part thereof, and finishing (brushing) step was carried out with SD1 (Fuji Photo Film Co., Ltd.), whereby a liquid crystal orientation control projection of a transparent pattern formed of only the negative type photosensitive transparent resin layer A1 and the spacer of a transparent pattern formed of the negative type photosensitive transparent resin layers A1 and P1 laminated together were formed on the glass substrate.

The negative type photosensitive transparent resin layer A1 has its substantial sensitivity to light in the wavelength range of 330 to 390 nm, and the negative type photosensitive transparent resin layer P1 has its substantial sensitivity to light in the wavelength range of 330 to 415 nm.

Then the assembly was baked at 240° C. for 50 minutes, whereby a spacer 622 which was 3.7 μm in height and a liquid crystal orientation control projection 624 which was 1.0 μm in height were formed on the ITO film. As can be understood from the description above, a high definition spacer 622 and a high definition liquid crystal orientation control projection 624 which are different from each other in height (thickness) can be formed easily and simultaneously with the method in accordance with this embodiment.

Another method of forming a spacer 622 and a liquid crystal orientation control projection 624 will be described, hereinbelow.

Also by the step which was the same as the preceding embodiment except that polyethylene terephthalate 75 μm thick which had not been provided with a primer was used in place of the PET temporary base which was used in [Production of the transfer sheet] in the preceding embodiment, and a negative type photosensitive transparent resin solution for a transparent layer (A1 layer) having the recipe shown in the above table 1 was coated directly on the surface of this temporary base without forming a thermoplastic resin layer and an interlayer and dried to form a negative type photosensitive transparent resin layer A1 1.2 μm thick, the spacer 622 and the liquid crystal orientation control projection 624 could be formed.

Further, by the step which was the same as the preceding embodiment except that the fiber array source 66 of the exposure system was arranged to emit a laser beam at 405 nm and 365 nm, the negative type photosensitive transparent resin layer P1 was exposed to a laser beam of 405 nm at 4 mJ/cm$^2$ and the negative type photosensitive transparent resin layer A1 was exposed to a laser beam of 365 nm at 40 mJ/cm$^2$ in place of exposing the negative type photosensitive transparent resin layers P1 and A1 with two-valued energy amounts, a high definition spacer 622 and a high definition liquid crystal orientation control projection 624 could be formed.

An exposure method in accordance with still another embodiment of the present invention will be described, hereinbelow. In the method of this embodiment, a plurality of kinds of structural members are formed on the substrate material. More specifically, a light transmitting RGB member and a light reflecting RGB member are formed on a LCD-CF panel (substrate material) as structural members.

First, referring to FIG. 27, a color filter comprising a light transmitting RGB member and a light reflecting RGB member will be described. The color filter can be obtained by laminating a transfer sheet to a light transmitting substrate 610A in contact therewith to form a first negative type photosensitive colored resin layer (a first colored layer) which is relatively higher in photosensitivity and a second negative type photosensitive colored resin layer (a second colored layer) which is relatively lower in photosensitivity, subsequently exposing to a laser beam from the side of the light transmitting substrate 610A on which the colored layer has been formed with the part to make a reflecting type liquid crystal display at a low energy and with the part to make a light transmitting type liquid crystal display at a high energy, and subsequent development.

That is, in the part to make a reflecting type liquid crystal display, only the first colored layer is left, and the part to make a reflecting type liquid crystal display is formed of a pixel portion 614B. Whereas, in the part to make a transmitting type liquid crystal display, the first and second colored layers are left, and the part to make a transmitting type liquid crystal display is formed of a pixel portion 614A. That is, a pixel portion 614A and a pair of pixel portions 614B on opposite sides of the pixel portion 614A forms a colored pixel (R, G or B) 614. The pixel portion 614A where the first and second colored layers are left is thicker than the pixel portion 614B where only the first colored layer is left by the thickness of the second colored layer, whereby the pixel portion 614A is formed in a thickness suitable as a light transmitting type pixel and the pixel portion 614B is formed in a thickness suitable as a light reflecting type pixel.

Three PFT temporary bases on each of which a thermoplastic resin layer and an interlayer had been thus provided in advance were prepared and a negative type photosensitive transparent resin solution for a red layer (R1 layer), a green layer (G1 layer) or a blue layer (B1 layer) having the recipe shown in the following table 3 was further coated on the interlayer of each of the temporary base, and dried to form a negative type photosensitive resin layer R1, G1 or B1 1.2 µm thick. Subsequently, polypropylene cover film (12 µm in thickness) was contact-bonded on each of the negative type photosensitive transparent resin layers R1, G1 and B1, whereby three photosensitive transfer sheets R1, G1 and B1 where a thermoplastic resin layer, an interlayer and a negative type photosensitive transparent resin layer were laminated were produced.

TABLE 3

|  | R1 | G1 | B1 |
|---|---|---|---|
| benzyl methacrylate/methacrylic acid copolymer [mole ratio] = 73/27, molecular weight 30000) | 7.8 | 10.2 | 9.8 |
| dipentaerythritol hexaacrylate | 5.2 | 4.6 | 6.1 |
| fluorine surface active agent (MegaFac F-176, Dainippon Ink and Chemicals Incorporated) | 0.06 | 0.14 | 0.12 |
| 7-[2-[4-(hydroxymethylpiperidino)-6-diethylamino] triazilamino]-3-phenylcoumarin | 1.49 | 1.26 | 0.25 |
| 2-trichloro(methyl)-5-(p-styrylstyryl)-1,3,4-oxadiazole | 0.32 | 0.22 | 0.23 |
| phenothiazine | 0.012 | 0.006 | 0.025 |
| C.I.PR254 dispersion (FUJIFILM OLIN CO. Ltd. RT-107) | 8.6 | 0 | 0 |
| C.I.PG36 dispersion (FUJIFILM OLIN CO. Ltd. GT-2) | 0 | 5.6 | 0 |
| C.I.PY138 dispersion (FUJIFILM OLIN CO. Ltd. YT-123) | 0 | 3.9 | 0 |
| C.I.PB 15:6 dispersion (MIKUNI COLOR Ltd. MHI blue-7075M) | 0 | 0 | 13.2 |
| polypropylene glycol monomethyl ether acetate | 27 | 26 | 14 |
| methyl ethyl ketone | 35 | 34 | 44 |

In this structure, light emitted from a backlight 620 passes through the light transmitting pixel portion 614A to the viewing side as shown. Whereas, light entering the structure from the viewing side as shown by b in FIG. 27 is reflected by an reflecting plate (a reflecting electrode) 612 and returns to the viewing side through a light reflecting pixel portion 614B as shown by c in FIG. 27.

A specific step will be described hereinbelow.

[Production of the Transfer Sheet]

The surface of a temporary base of polyethylene terephthalate (PFT temporary base) film 75 µm thick was primed with a gelatin layer 0.2 µm thick and a coating solution having the recipe H1 the same as described above was coated on the surface of the gelatin layer and dried to form a thermoplastic resin layer 20 µm thick in dry thickness.

Further, a coating solution having the recipe B1 the same as described above was coated on the thermoplastic resin layer and dried to form an interlayer 1.6 µm thick in dry thickness.

Another polyethylene terephthalate film temporary base 75 µm thick was prepared. A coating solution having the above recipe H1 was coated on the surface of the TFT and dried to form a thermoplastic resin layer 20 µm thick in dry thickness. Further, a coating solution having the above recipe B1 was coated on the thermoplastic resin layer and dried to form an interlayer 1.6 µm thick in dry thickness. Three PFT temporary bases on each of which a thermoplastic resin layer and an interlayer had been thus provided were prepared and a negative type photosensitive transparent resin solution a red layer (R2 layer), a green layer (G2 layer) or a blue layer (B2 layer) having the recipe shown in the following table 4 was further coated on the interlayer of each of the temporary base, and dried to form a negative type photosensitive resin layer R2, G2 or B2 1.2 µm thick. Subsequently, polypropylene cover film (12 µm in thickness) was contact-bonded on each of the negative type photosensitive transparent resin layers, whereby three photosensitive transfer sheets where a thermoplastic resin layer, an interlayer and a negative type photosensitive transparent resin layer (R2, B2 or G2) were laminated were produced.

TABLE 4

|  | R2 | G2 | B2 |
|---|---|---|---|
| benzyl methacrylate/methacrylic acid copolymer [mole ratio] = 73/27, molecular weight 30000) | 7.8 | 10.2 | 9.8 |
| dipentaerythritol hexaacrylate | 5.2 | 4.6 | 6.1 |
| fluorine surface active agent (MegaFac F-176, Dainippon Ink and Chemicals Incorporated) | 0.06 | 0.14 | 0.12 |

TABLE 4-continued

| | R2 | G2 | B2 |
|---|---|---|---|
| 7-[2-[4-(hydroxymethylpiperidino)-6-diethylamino]triazilamino]-3-phenylcoumarin | 1.49 | 1.26 | 0.25 |
| 2-trichloro(methyl)-5-(p-styrylstyryl)-1,3,4-oxadiazole | 0.32 | 0.22 | 0.23 |
| phenothiazine | 0.012 | 0.006 | 0.025 |
| C.I.PR254 dispersion (FUJIFILM OLIN CO. Ltd. RT-107) | 19.2 | 0 | 0 |
| C.I.PG36 dispersion (FUJIFILM OLIN CO. Ltd. GT-2) | 0 | 11.3 | 0 |
| C.I.PY138 dispersion (FUJIFILM OLIN CO. Ltd. YT-123) | 0 | 7.8 | 0 |
| C.I.PB 15:6 dispersion (MIKUNI COLOR Ltd. MHI blue-7075M) | 0 | 0 | 26.4 |
| polypropylene glycol monomethyl ether acetate | 27 | 26 | 14 |
| methyl ethyl ketone | 35 | 34 | 44 |

The photosensitivity $h^1$ of the negative type photosensitive resin layer of the photosensitive transfer sheets R1, B1 and G1 and the photosensitivity $h^2$ of the negative type photosensitive resin layer of the photosensitive transfer sheets R2, B2 and G2 were adjusted so that the ratio of the photosensitivity $h^1/h^2$ was 10 for each color.

[Production of the Color Filter]

Color filters were made in the following manner by the use of six kinds of transfer sheets described above.

The cover film of the photosensitive transfer sheet R1 was peeled off and the surface of the exposed negative type photosensitive resin layer R1 thereof is pressed (0.8 kg/cm2) against the glass substrate (1.1 mm thick) and heated (130° C.) by the use of a laminator (VP-II, Taisei Laminator Co. Ltd.), thereby laminating the negative type photosensitive resin layer R1 and the glass substrate. Thereafter, the photosensitive transfer sheet R1 was peeled along the interface between the interlayer and the negative type photosensitive resin layer R1, whereby only the transparent negative type photosensitive resin layer R1 was transferred to the glass substrate. Thereafter, the cover film of the photosensitive transfer sheet R2 was peeled off and the surface of the exposed negative type photosensitive resin layer R2 thereof was laminated to the negative type photosensitive resin layer R1 in the same manner as described above. Thereafter, the photosensitive transfer sheet R2 was peeled along the interface between the temporary base and the thermoplastic resin layer, and transfer was carried out so that the negative type photosensitive resin layer R1/the negative type photosensitive resin layer R2/the interlayer/the thermoplastic resin layer were transferred to the glass substrate in this order.

Thereafter, by the exposure system arranged as described above, exposure was carried out with a laser beam of 405 nm at 4 mJ/cm² and at 40 mJ/cm². At this time, the part where only the negative type photosensitive resin layer R1 was to be left to form the reflecting type pixel portion 614B was exposed at 4 mJ/cm², and the part where both the negative type photosensitive resin layer R1 and the negative type photosensitive resin layer R2 were to be left to form the light transmitting type pixel portion 614A was exposed at 40 mJ/cm². The exposure can be changed in this manner, for instance, by applying the exposure control (e.g., the thinning).

Then the negative type photosensitive resin layer R2 was developed with developer PD2 (Fuji Photo Film Co., Ltd.) and the thermoplastic resin layer and the interlayer were removed. At this time, the negative type photosensitive resin layer R1 was not substantially developed. Thereafter, the negative type photosensitive transparent resin layer R1 was developed with developer CD1 (Fuji Photo Film Co., Ltd.) to remove the unnecessary part thereof, and finishing (brushing) step was carried out with SD1 (Fuji Photo Film Co., Ltd.), whereby a red pattern (reflecting display portion) formed of only the negative type photosensitive resin layer R1 and the a red pattern (light transmitting display portion) formed of the negative type photosensitive resin layers R1 and R2 laminated together were formed on the glass substrate 610A.

Thereafter, the photosensitive transfer sheets G1 and G2 were laminated on the glass substrate on which the red pattern had been formed in sequence in the same manner as described above, and peeling, exposure and development were repeated, whereby a green pattern (reflecting display portion) formed of only the negative type photosensitive resin layer G1 and the a green pattern (light transmitting display portion) formed of the negative type photosensitive resin layers G1 and G2 laminated together were formed. The same operation was repeated by the use of the photosensitive transfer sheets B1 and B2, whereby a blue pattern (reflecting display portion) formed of only the negative type photosensitive resin layer B1 and the a blue pattern (light transmitting display portion) formed of the negative type photosensitive resin layers B1 and B2 were formed on the transparent glass substrate on which the red and green patterns had been formed and a color filter having RGB patterns which conforms to both the light transmission and the light reflection was obtained.

A color filter where color pixels (R, G, B) of the light reflecting type and the light transmitting type are provided for each color in an area which forms a pixel in display can be thus formed easily at a high resolution.

Another method of forming a color filter for both the light transmission and the light reflection will be described, hereinbelow.

Also by the step which was the same as the preceding embodiment except that polyethylene terephthalate 75 μm thick which had not been provided with a primer was used in place of the PET temporary base which was used in [Production of the transfer sheet] in the preceding embodiment, and a negative type photosensitive resin solution for a red layer (R1 layer), a green layer (G1 layer) or a blue layer (B1 layer) having the recipe shown in the above table 3 was directly coated on the surface of this temporary base without forming a thermoplastic resin layer and an interlayer and dried to form a negative type photosensitive transparent resin layers R1, B1 and G1 each 1.2 μm thick, a color filter where color pixels (R, G. B) were provided for each color in an area which formed a pixel in display could be formed easily at a high resolution.

An exposure method in accordance with still another embodiment of the present invention will be described with reference to FIGS. 28 to 34, hereinbelow. In the method of this embodiment, a structural member is formed by photoresist on a substrate material and then the photoresist is stepwise removed to form another structural member, thereby forming two or more than two structural members on the substrate material. More specifically, a TFT circuit is formed by the structural member in this embodiment.

FIGS. 28 to 34 show in sequence a step of producing an active matrix of a high opening ratio in this manner. A G-S intersection where a gate electrode and a source electrode intersect with each other, a TFT element portion, a pixel portion, and a terminal portion are shown side by side in a schematic cross-section here.

Figure 28A:
FIGS. 28A to 28C are views showing a step of producing an active matrix substrate.
Figure 28B:
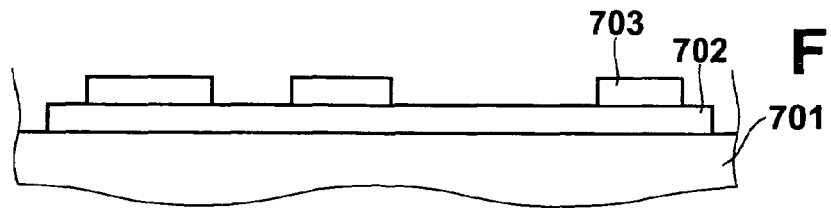
Figure 28C:
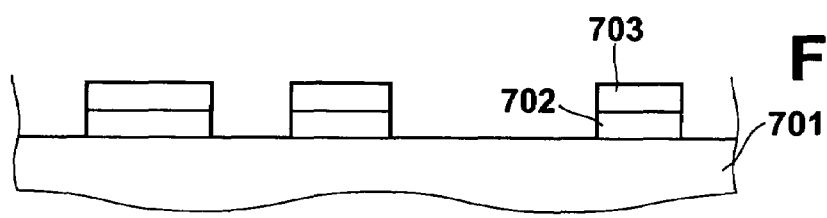

FIG. 28A shows a state where gate electrode film 702 has been formed on a glass substrate 701. The gate electrode film 702 is formed by, for instance, sputtering as metal film such as of chromium, aluminum, or tantalum. FIG. 28B shows a state where photoresist has been uniformly coated on the gate electrode film 702 and then a resist pattern 703 is formed by the use of a first photo-mask. FIG. 28C shows a state where the gate electrode film 702 is patterned by etching using the resist pattern 703.

Figure 29D:
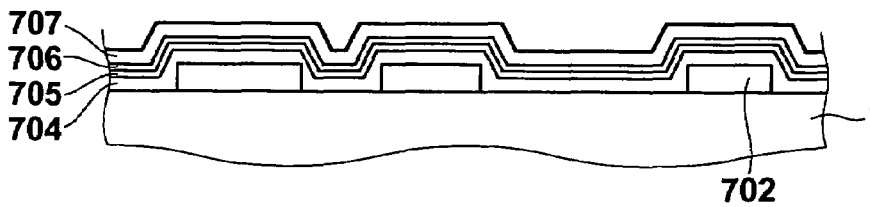
FIGS. 29D to 29F are views showing the step of producing the active matrix substrate.

Then after the resist pattern 703 is removed, gate insulating film 704, a first semiconductor layer 705 and a second semiconductor layer 706 are formed and laminated in contact and source/drain electrode film 707 is formed and laminated in contact therewith, for instance, by plasma CVD or sputtering as shown in FIG. 29D. The gate insulating film 704 is formed, for instance, of silicon nitride $(SiN_x)$ film the first semiconductor layer 705 is formed of amorphous silicon (a-Si) film. The second semiconductor layer 706 is formed of silicon ($n^+$-Si) film doped with n-type impurity in high concentration. The source/drain electrode film 707 is formed of metal such as chromium, aluminum, or tantalum.

Figure 29E:
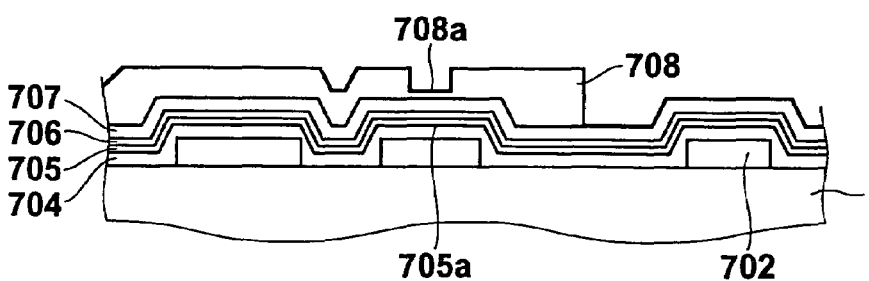

Then as shown in FIG. 29E, after photoresist is coated over the entire area of the front surface of the glass substrate 701, exposure where the exposure is changed area by area is carried out, whereby a resist pattern 708 having a plurality of stages of thicknesses is formed by one resist coating, exposure and development. The resist pattern 708 is not formed in the parts of the pixel portion and the terminal portion. Further, the part corresponding to a channel portion 705a is formed as a thin wall portion 708a, and the other part is formed thick. That is, the other part is formed thicker than a first thickness which is a predetermined thickness, and the thin wall portion 708a is formed in a second thickness thinner than the first thickness. Also, in this case, the exposure where the exposure is changed area by area can be carried out by applying the exposure control described above (e.g., the thinning).

Figure 29F:
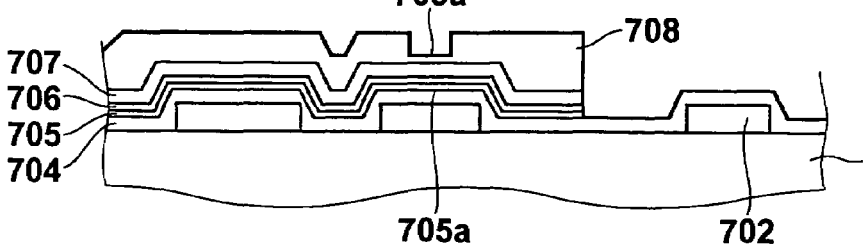

Thereafter, the part of the first and second semiconductor layers 705 and 706 and the source/drain electrode film 707 which are not covered with the resist pattern 708 is wholly removed by etching as shown in FIG. 29F.

Then, the overall thickness of the resist pattern 708 remaining in FIG. 29F is reduced by ashing, thereby exposing the surface of the source/drain electrode film 707 at the channel portion 705a corresponding to the thin wall portion 708a as shown in FIG. 30G.

FIG. 30H shows a state where the source/drain electrode separation and the channel etching have been carried out by the use of the remaining resist pattern 708. At the channel portion 705a, the thickness of the first semiconductor layer 705 is adjusted and the second semiconductor layer 706 and the source/drain electrode film 707 are removed. FIG. 30I shows a state where the resist pattern 708 has been removed.

FIG. 31J shows a state where passivation film 709 is formed over the entire surface of the substrate. The passivation film 709 is a protective film formed, for instance, of silicon nitride (SiNx) and is formed by, for instance, the CVD method or the sputtering.

FIG. 31K shows a state where after electrically insulating synthetic resin material such as acrylic resin is coated on the passivation film 709, the surface is flattened to form electrically insulating acrylic resin film 710 having a flat surface. FIG. 31L shows a state where a water-repellent resin layer 711 is formed by pre-baking the acrylic resin film 710 at 80 to 100° C., and coating thereon a fluorine plastic, and a photoresist layer 712 is formed thereon by coating photoresist on the water-repellant resin layer 711.

Figure 32M:
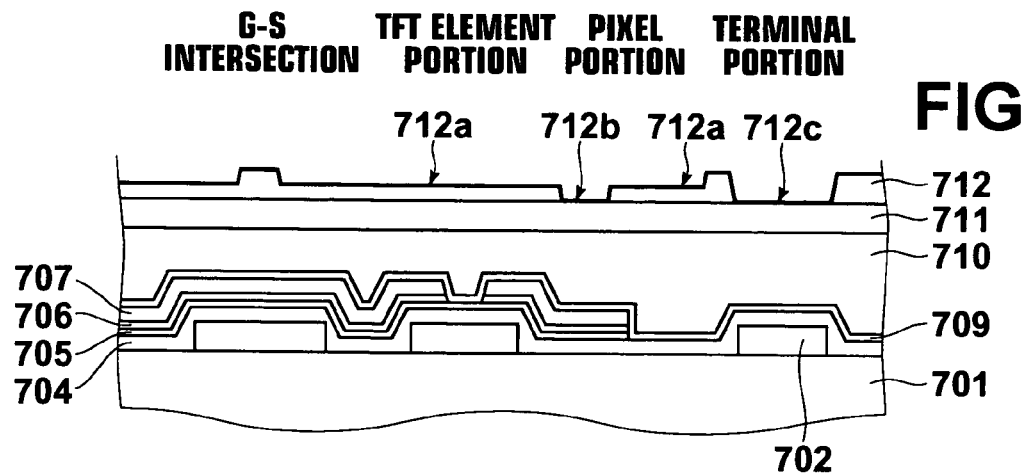
FIGS. 32M to 32O are views showing the step of producing the active matrix substrate.

FIG. 32M shows a state where the exposure is adjusted by the use of a slit mask as a third photo-mask and the photoresist layer 712 is exposed to light with a changing exposure, whereby the photoresist layer 712 is patterned into a multi-stage pattern shape by one exposure and development.

By this exposure, the photoresist layer 712 is exposed to light and developed so that the photoresist layer 712 is kept unsolidified in a predetermined contact-hole area 712b within a pixel electrode forming area, partly solidified in a recess 712a which is a pixel electrode forming area other than the contact-hole area 712b, and solidified at the area other than the parts. Also in this case, the exposure can be changed area by area, for instance, by applying the thinning described above.

Figure 32N:
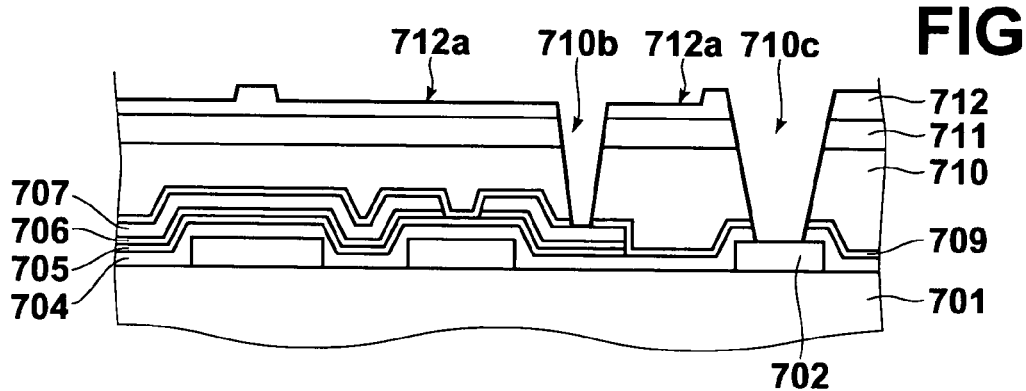
Figure 32O:
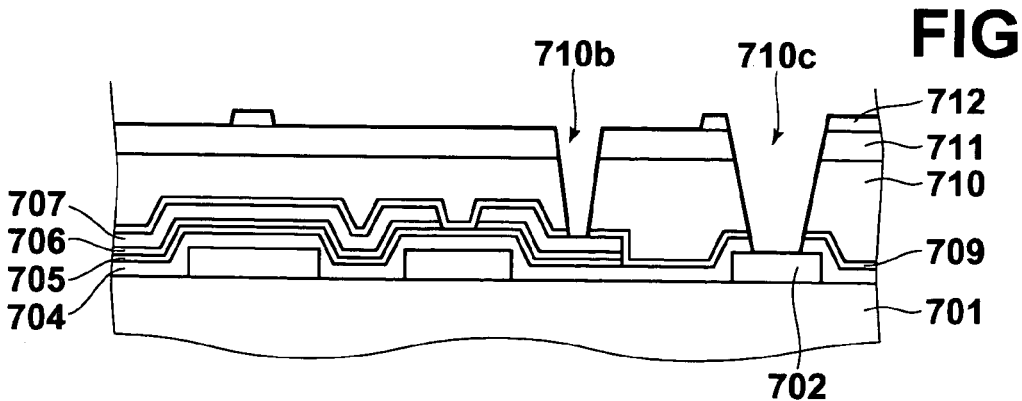

FIG. 32N shows a state where the acrylic resin film 710 and the passivation film 709 are etched by the use of a first resist pattern of the photoresist layer 712 as a mask, whereby a contact hole 710b which is a through hole reaching the drain electrode from the surface of the acrylic resin film 710 is formed. At this time, the passivation film 709 and the gate insulating film 704 are removed, a contact hole 710b which is a through hole to the gate electrode and the source electrode (not shown) is formed, and the gate electrode film 702 and the source electrode film (not shown) are exposed in the terminal portion. Since the water-repellent resin layer 711 is thick, the part of the water-repellent resin layer 711 corresponding to the contact holes 710b and 710c can be removed by a process similar to the lift-off. FIG. 32O shows a state where the overall thickness of the photoresist layer 712 is reduced by ashing to form a second resist pattern.

Figure 33P:
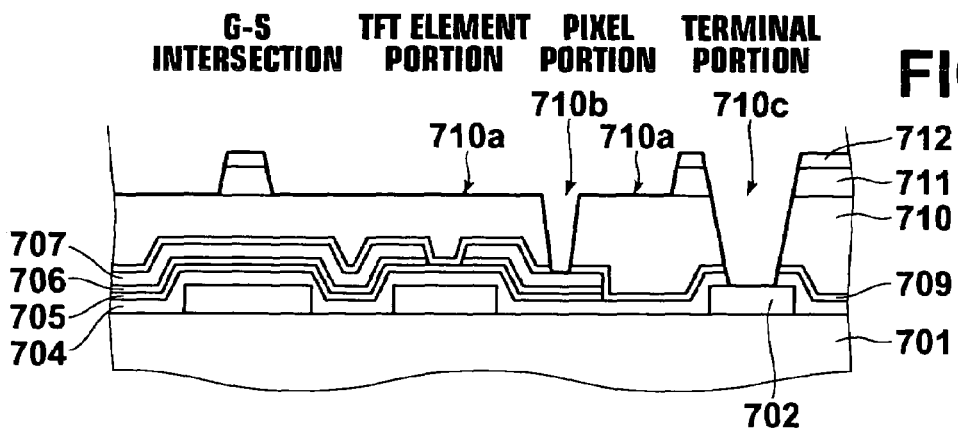
FIGS. 33P to 33R are views showing the step of producing the active matrix substrate, and FIG. 34S are a view showing the step of producing the active matrix substrate.
Figure 33Q:
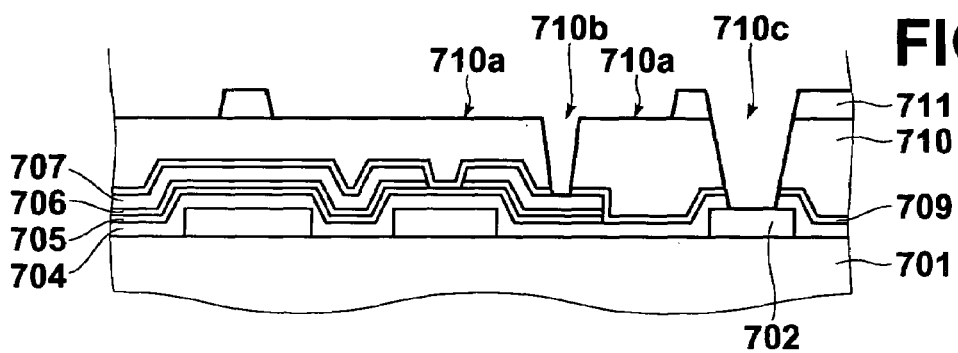

FIG. 33P shows a state where the water-repellent resin layer 711 is etched by the use of the second resist pattern of the photoresist layer 712 as a mask, whereby a recess 710a merging into a contact hole is formed in the acrylic resin film 710. FIG. 33Q shows a state where the photoresist layer 712 remaining on FIG. 33P is removed.

Figure 33R:
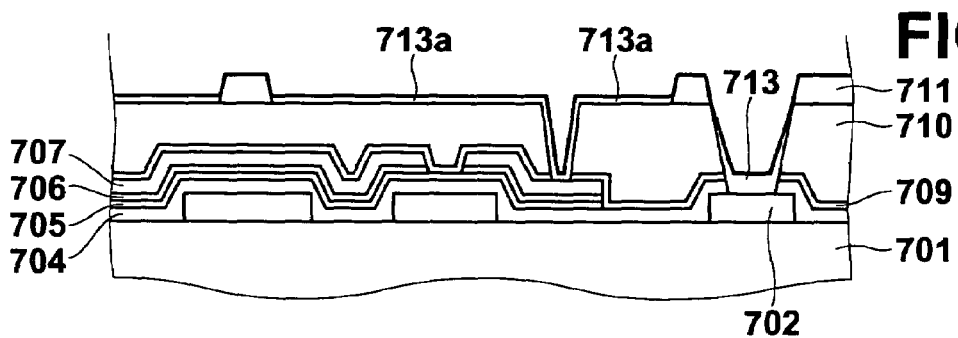

FIG. 33R shows a state where a coated transparent conductive film 713 is formed by coating coating type transparent conductive material, for instance, by spin coating. The coated transparent conductive film 713 covers the surface of the recess 710a of the acrylic resin film 710 and the inner surface of the contact-holes 710b and 710c. Since the water-repellent resin layer 711 repels the coating type transparent conductive material due to its water-repellency, the coated transparent conductive film 713 is not formed at the part where the water-repellent resin layer 711 remains.

Figure 34S:
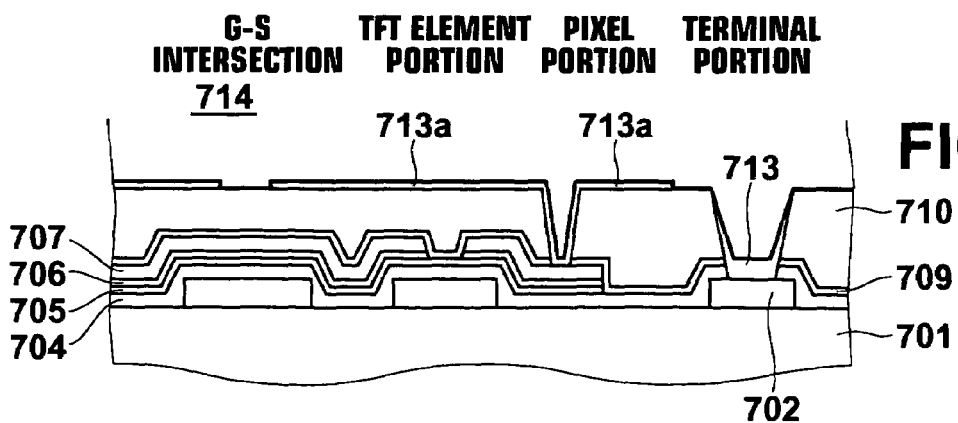

By subsequent calcination at 200 to 250° C., a pixel electrode 713a is formed. The coated transparent conductive film 713 can be formed of, for instance, indium tin oxide (ITO). In this embodiment, since coating type transparent conductive material such as ITO is coated to form the pixel electrode, the pixel electrode can be formed without use of a vacuum film-forming method such as plasma CVD or sputtering, whereby the production cost can be lowered. FIG. 34S shows a state where the remaining water-repellent resin layer 711 is removed after formation of the pixel electrode 713*a* by ashing or the like. With this, an active matrix substrate 714 of a high opening ratio is formed.

What is claimed is:

1. An exposure method for projecting light modulated by a spatial light modulator element onto photosensitive material, thereby exposing the photosensitive material in a predetermined pattern, the method comprising controlling an action of the spatial light modulator element so that an amount of the light projected onto the photosensitive material is changed in at least two stages according to a part of the photosensitive material, whereby a plurality of exposed areas different from each other in an amount of the light to which an exposed area of the plurality of exposed areas is exposed in at least two stages can be formed in the photosensitive material.

2. An exposure method as defined in claim 1 in which the spatial light modulator element comprises an element which is formed by a plurality of two-dimensionally arranged pixels.

3. An exposure method as defined in claim 2 in which the spatial light modulator element comprises an element which is formed by a plurality of two-dimensionally arranged pixels and in which the exposure light is selectively turned on and off for each of the pixels, and the amount of the exposure light to which the photosensitive material is exposed is changed by controlling the time for which each of the pixels of the spatial light modulator element is kept on.

4. An exposure method as defined in claim 2 in which the spatial light modulator element comprises an element which is formed by a plurality of two-dimensionally arranged pixels and in which the exposure light is selectively turned on and off for each of the pixels, a sub-scanning to move the spatial light modulator element and the photosensitive material relatively to each other in one direction is effected, and the number of pixels which are continuous in the sub-scanning direction and project the exposure light onto the same part of the photosensitive material is controlled to change the amount of the exposure light to which the same part of the photosensitive material is exposed.

5. An exposure method as defined in claim 4 in which only a continuous part of the spatial light modulator element is used for modulation of the exposure light.

6. An exposure method as defined in claim 4 in which dots of the light traveling through a plurality of pixels continuous in the sub-scanning direction are projected onto the photosensitive material, and the amount of the exposure light is changed by thinning the dots.

7. An exposure method as defined in claim 6 in which light modulated by the spatial light modulator element is projected onto the photosensitive material through an optical system, and the dots are thinned in a predetermined pattern reflecting the optical characteristics of the optical system.

8. An exposure method as defined in claim 6 in which the dots which form an edge portion of the image are not thinned.

9. An exposure method as defined in claim 6, wherein the thinning of the dots comprises reducing a number of the dots.

10. An exposure method as defined in claim 1 in which a DMD (digital micro-mirror device) is used as the spatial light modulator element.

11. An exposure method as defined in claim 1 in which the photosensitive material is photoresist formed on substrate material or material of a structural member provided on the substrate material to process the substrate material or the material of a structural member provided on the substrate material.

12. An exposure method as defined in claim 11 in which the photoresist is two-layered photoresist comprising a layer of relatively high photosensitivity formed on the substrate material and a layer of relatively low photosensitivity formed on the layer of relatively high photosensitivity.

13. An exposure method as defined in claim 12 in which the ratio of the exposure when only the layer of relatively high photosensitivity is to be left to the exposure when the layer of relatively high photosensitivity and the layer of relatively low photosensitivity are both to be left is in the range of 0.01 to 0.5.

14. An exposure method as defined in claim 11 in which two or more structural members are formed by stepwise removing the parts of the photoresist which are different from each other in exposure.

15. An exposure method as defined in claim 11 in which the substrate material is an LCD-TFT panel and the material of the structural member is for forming a TFT circuit.

16. An exposure method as defined in claim 1 in which the substrate material is conductive film and the photosensitive material is two-layered photosensitive material comprising a layer of relatively high photosensitivity formed on the substrate material and a layer of relatively low photosensitivity formed on the layer of relatively high photosensitivity.

17. An exposure method as defined in claim 16 in which the ratio of the exposure when only the layer of relatively high photosensitivity is to be left to the exposure when the layer of relatively high photosensitivity and the layer of relatively low photosensitivity are both to be left is in the range of 0.01 to 0.5.

18. An exposure method as defined in claim 1 in which the photosensitive material is a kind of material of a structural member left on the substrate material to have a part different in thickness in at least two stages.

19. An exposure method as defined in claim 18 in which the substrate material is an LCD-TFT panel, and the material of a structural member is material of a reflecting member which is formed on the panel to have irregularities on its surface.

20. An exposure method as defined in claim 1 in which the photosensitive material comprises material of two or more structural members to be left on the substrate material.

21. An exposure method as defined in claim 20 in which the material of the structural members is two-layered photosensitive material comprising a layer of relatively high photosensitivity formed on the substrate material and a layer of relatively low photosensitivity formed on the layer of relatively high photosensitivity.

22. An exposure method as defined in claim 21 in which the ratio of the exposure when only the layer of relatively high photosensitivity is to be left to the exposure when the layer of relatively high photosensitivity and the layer of relatively low photosensitivity are both to be left is in the range of 0.01 to 0.5.

23. An exposure method as defined in claim 20 in which the substrate material is an LCD-CF panel, and the material of the structural member comprises at least material of a rib member and material of a column.

24. An exposure method as defined in claim 20 in which the substrate material is an LCD-CF panel, and the material of the structural member comprises at least material of a light-transmitting RGB member and a light-reflecting RGB member.

25. An exposure system for projecting light modulated by a spatial light modulator element onto photosensitive material, thereby exposing the photosensitive material in a predetermined pattern, the system comprising an exposure control means which controls an action of the spatial light modulator element so that an amount of the light projected onto the photosensitive material is changed in at least two stages according to a part of the photosensitive material, whereby a plurality of exposed areas different from each other in an amount of the light to which an exposed area of the plurality of exposed areas is exposed in at least two stages can be formed in the photosensitive material.

26. An exposure system as defined in claim 25 in which the spatial light modulator element comprises an element which is formed by a plurality of two-dimensionally arranged pixels.

27. An exposure system as defined in claim 26 in which the spatial light modulator element comprises an element which is formed by a plurality of two-dimensionally arranged pixels and in which the exposure light is selectively turned on and off for each of the pixels, a sub-scanning means which moves the spatial light modulator element and the photoresist relatively to each other in one direction is provided, and the exposure control means comprises a means which controls the number of pixels which are continuous in the sub-scanning direction and project the exposure light onto the same part of the photoresist.

28. An exposure system as defined in claim 27 in which the means which controls the number of pixels projecting the exposure light projects dots of the light traveling through the plurality of pixels continuous in the sub-scanning direction onto the photosensitive material, and changes the amount of the exposure light by thinning the dots.

29. An exposure system as defined in claim 28 further comprising an optical system through which light modulated by the spatial light modulator element is projected onto the photosensitive material wherein the means which controls the number of pixels thins the dots in a predetermined pattern reflecting the optical characteristics of the optical system.

30. An exposure system as defined in claim 28 in which the means which controls the number of pixels does not thin the dots which form an edge portion of the image.

31. An exposure system as defined in claim 26 in which the spatial light modulator element comprises an element which is formed by a plurality of two-dimensionally arranged pixels and in which the exposure light is selectively turned on and off for each of the pixels, and the exposure control means is formed by a means for controlling the time for which each of the pixels of the spatial light modulator element is kept on.

32. An exposure system as defined in claim 27 in which only a continuous part of the spatial light modulator element is used for modulation of the exposure light.

33. An exposure system as defined in claim 28, wherein the thinning of the dots comprises reducing a number of the dots.

34. An exposure system as defined in claim 25 in which a DMD is used as the spatial light modulator element.

35. An exposure method for projecting light modulated by a spatial light modulator element onto photosensitive material, thereby exposing the photosensitive material in a predetermined pattern, the method comprising controlling an action of the spatial light modulator element so that an amount of the light projected onto the photosensitive material is changed in at least two stages according to a part of the photosensitive material, whereby a plurality of exposed areas different from each other in an amount of the light to which an exposed area of the plurality of exposed areas is exposed in at least two stages can be formed in the photosensitive material, wherein dots of the light traveling through a plurality of pixels in a sub-scanning direction are projected onto the photosensitive material, and an amount of light exposing the photosensitive material is changed by thinning the dots.

36. An exposure method as defined in claim 35, wherein the thinning of the dots comprises reducing a number of the dots.

37. An exposure method as defined in claim 35, wherein the sub-scanning direction comprises a continuous direction.

* * * * *